(12) United States Patent
Cho

(10) Patent No.: US 9,806,474 B2
(45) Date of Patent: Oct. 31, 2017

(54) PRINTED CIRCUIT BOARD HAVING HIGH-SPEED OR HIGH-FREQUENCY SIGNAL CONNECTOR

(71) Applicant: Samsung Electronics Co., Ltd., Suwon-si (KR)

(72) Inventor: Yong-hee Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/375,744

(22) Filed: Dec. 12, 2016

(65) Prior Publication Data

US 2017/0179653 A1    Jun. 22, 2017

(30) Foreign Application Priority Data

Dec. 18, 2015  (KR) ........................ 10-2015-0182089

(51) Int. Cl.
*H05K 9/00* (2006.01)
*H01R 24/50* (2011.01)
(Continued)

(52) U.S. Cl.
CPC ........... *H01R 24/50* (2013.01); *H01R 12/722* (2013.01); *H01R 2103/00* (2013.01)

(58) Field of Classification Search
USPC .................................... 361/818, 816, 679.01
See application file for complete search history.

(56) References Cited

U.S. PATENT DOCUMENTS

| 4,908,576 A | 3/1990 | Jackson |
| 5,853,297 A | 12/1998 | Moulton et al. |
| (Continued) | | |

FOREIGN PATENT DOCUMENTS

| JP | 2000-353559 | 12/2000 |
| JP | 2001-349926 | 12/2001 |
| (Continued) | | |

OTHER PUBLICATIONS

International Search Report dated Feb. 20, 2017 in corresponding International Patent Application No. PCT/KR2016/014211.

(Continued)

*Primary Examiner* — Andargie M Aychillhum
(74) *Attorney, Agent, or Firm* — Staas & Halsey LLP

(57) ABSTRACT

A printed circuit board includes a substrate including a surface layer and a first ground layer; a high-frequency signal generation part provided in the surface layer of the substrate; at least one high-frequency signal connector mounting portion formed in the surface layer of the substrate; at least one high-frequency signal line formed in the surface layer of the substrate, and extend from the high-frequency signal generation part to the at least one high-frequency signal connector mounting portion; and at least one high-frequency signal connector disposed in the at least one high-frequency signal connector mounting portion, wherein an end of the first ground layer is exposed to a side surface of the substrate, and when the high-frequency signal connector is disposed in the at least one high-frequency signal connector mounting portion, a ground of the high-frequency signal connector is in contact with the end of the first ground layer.

20 Claims, 19 Drawing Sheets

(51) Int. Cl.
*H01R 12/72* (2011.01)
*H01R 103/00* (2006.01)

(56) References Cited

U.S. PATENT DOCUMENTS

| | | | |
|---|---|---|---|
| 5,923,176 | A | 7/1999 | Porter et al. |
| 6,238,218 | B1 | 5/2001 | Baffert |
| 7,173,827 | B2 * | 2/2007 | Sugimoto ............ H05K 1/0218 361/752 |
| 8,476,532 | B2 * | 7/2013 | Kitano ................. H05K 1/0215 174/254 |
| 2004/0038587 | A1 | 2/2004 | Yeung et al. |
| 2008/0102654 | A1 | 5/2008 | Kari |
| 2011/0217853 | A1 | 9/2011 | Cornic et al. |
| 2012/0088402 | A1 | 4/2012 | Li et al. |
| 2012/0306598 | A1 | 12/2012 | Izadian |

FOREIGN PATENT DOCUMENTS

| | | |
|---|---|---|
| JP | 2012-127719 | 7/2012 |
| JP | 2013-148500 | 8/2013 |
| KR | 10-2013-0068354 | 6/2013 |

OTHER PUBLICATIONS

Written Opinion dated Feb. 20, 2017 in corresponding International Patent Application No. PCT/KR2016/014211.

* cited by examiner

PRINTED CIRCUIT BOARD HAVING HIGH-SPEED OR HIGH-FREQUENCY SIGNAL CONNECTOR

CROSS-REFERENCE TO RELATED APPLICATIONS

This application claims priority from Korean Patent Application No. 10-2015-0182089 filed Dec. 18, 2015 in the Korean Intellectual Property Office, the disclosure of which is incorporated herein by reference in its entirety.

BACKGROUND

1. Field

The present disclosure relates to a printed circuit board that can transmit and receive high-speed or high-frequency signals. More particularly, the present disclosure relates to a printed circuit board having a high speed or high-frequency signal connector that can minimize loss of high speed or frequency signals which are input or generated and send the high speed or frequency signals to the high speed or frequency signal connector.

2. Description of the Related Art

According to development of electronic technology, a core speed or frequency of a central process unit (CPU) is gradually becoming faster, and an amount of data to be processed has also gradually increased. Accordingly, the amount of data to be processed between two chips or between two devices has increased day by day.

Due to the increase in transmission rate and the increase in the amount of data transmitted between digital devices, interfaces connecting the digital devices are continuously changed. In order to increase the bandwidth and the transmission rate of transmission signals, the configuration of the interface is changed in the direction to increase the number of signal lines and the transmission rate.

In order to transmit and receive high-speed signals, for example, signals of a range of 5 GHz to 20 GHz between the two devices, it is required to minimize loss of the high-speed or high frequency signals at the time of transmission and to cause the loss of the signals to increase linearly in accordance with the increase of frequency even when the loss of the signals is generated.

For this purpose, it is necessary to change a structure of a portion for transmitting a high-speed or high-frequency signal to a high-speed or high-frequency signal connector of a printed circuit board to which a cable that is provided to send and receive the high-speed or high-frequency signals between the two devices is connected.

FIG. 1 is a view illustrating a conventional printed circuit board for signal branches 1 that is used as a cable measuring jig.

Referring to FIG. 1, a printed circuit board 2 is provided with a connection connector 3 and six SMA connectors 5. The connection connector 3 and the six SMA connectors 5 are connected by six signal connecting lines 7. In other words, six terminals of the connection connector 3 and the six SMA connectors 5 are connected in one-to-one by the six signal connecting lines 7.

Accordingly, when using the printed circuit board for signal branches 1 as illustrated in FIG. 1 and a measuring instrument capable of measuring cable characteristic values, such as an S-parameter, impedance, etc., the performance of high-speed or high frequency signal cables may be tested.

Since the printed circuit board for signal branches 1 according to the prior art as described above has the characteristics that the insertion loss of S-parameter increases linearly until a signal of approximately 5 GHz, the printed circuit board for signal branches 1 may be used for the transmission of signals of less than 5 GHz. However, since the printed circuit board for signal branches 1 according to the prior art has the characteristics that the insertion-loss changes irregularly in signals of more than 5 GHz, the printed circuit board for signal branches 1 cannot be used in the inspection of cables for transmitting the signals of more than 5 GHz.

Accordingly, a printed circuit board in which the insertion-loss of S-parameter can be linearly increased in accordance with the increase of the transmission frequency in the high-speed or high frequency signals of more than 5 GHz has been desired.

SUMMARY

Additional aspects and/or advantages will be set forth in part in the description which follows and, in part, will be apparent from the description, or may be learned by practice of the embodiments.

The present disclosure has been developed in order to overcome the above drawbacks and other problems associated with the conventional arrangement. An aspect of the present disclosure relates to a printed circuit board having a high-speed or high-frequency signal connector that can transmit and receive high-speed or high frequency signals.

According to an aspect of the present disclosure, a printed circuit board having a high-speed or high-frequency signal connector may include a substrate comprising at least two layers including a surface layer and a first ground layer; a high-speed or high-frequency signal generation part provided in the surface layer of the substrate; at least one high-speed or high-frequency signal connector mounting portion formed in the surface layer of the substrate; at least one high-speed or high-frequency signal line formed in the surface layer of the substrate, the at least one high-speed or high-frequency signal line extended from the high-speed or high-frequency signal generation part to the at least one high-speed or high-frequency signal connector mounting portion; and at least one high-speed or high-frequency signal connector disposed in the at least one high-speed or high frequency signal connector mounting portion, the at least one high-speed or high-frequency signal connector comprising a signal terminal connected to the high-speed or high-frequency signal line, wherein an end of the first ground layer positioned below the at least one high-speed or high frequency signal connector mounting portion is exposed to a side surface of the substrate, and wherein when the at least one high-speed or high-frequency signal connector is disposed in the at least one high-speed or high-frequency signal connector mounting portion, a ground of the at least one high-speed or high-frequency signal connector is in contact with the end of the first ground layer exposed to the side surface of the substrate.

The substrate may include second ground layer disposed below the first ground layer; and a connecting portion that connects the first ground layer and the second ground layer, and is exposed to the side surface of the substrate.

The connecting portion may include a plurality of vias that penetrate the high-frequency signal connector mounting portion, the first ground layer, and the second ground layer.

The ground of the at least one high-frequency signal connector and the plurality of vias may be connected to each other by solder filled in the plurality of vias.

The at least one high-frequency signal line may be formed in a straight line.

A width of the at least one high-frequency signal line may be the same as a width of the signal terminal of the high-frequency signal connector.

The at least one high-frequency signal connector mounting portion may include a plurality of high-frequency signal connector mounting portions. The at least one high-frequency signal line may include a plurality of high-frequency signal lines extended from the high-frequency signal generation part to the plurality of high-frequency signal connector mounting portions, and the plurality of high-frequency signal lines may have an identical length.

The high-frequency signal line may be spaced apart from the high-frequency signal connector mounting portion, and a gap between the high-frequency signal line and the high-frequency signal connector mounting portion may be determined so that impedance of the high-frequency signal line is approximately 50Ω.

The high-frequency signal connector mounting portion may include a plurality of vias connecting to the first ground layer.

Cutting surfaces of some vias that are parallel to the side surface of the substrate among the plurality of vias may be formed to be exposed to the side surface of the substrate.

When at least one via is provided in the substrate, the at least one via may be spaced apart from the high-frequency signal line by a distance in that the at least one via does not affect impedance of the high-frequency signal line.

The high-frequency signal generation part may be provided with a high-frequency signal receiving connector.

According to another aspect of the present disclosure, a printed circuit board having a high-frequency signal connector may include a substrate comprising a surface layer, a first ground layer, a second ground layer, and a bottom layer that are laminated in sequence; a high-frequency signal receiving portion formed in the surface layer of the substrate; a plurality of high-frequency signal connector mounting portions formed in the surface layer of the substrate; a plurality of high-frequency signal lines formed in the surface layer of the substrate, the plurality of high-frequency signal lines extended from the high-frequency signal receiving portion to the plurality of high-frequency signal connector mounting portions; and a plurality of high-frequency signal connectors disposed in the plurality of high-frequency signal connector mounting portions, each of the plurality of high-frequency signal connectors comprising a signal terminal connected to each of the plurality of high-frequency signal lines, wherein the substrate comprises a plurality of vias that connect the first ground layer positioned below the plurality of high-frequency signal connector mounting portions and the second ground layer positioned below the first ground layer, wherein an end of the first ground layer, an end of the second ground layer, and cutting surfaces of some of the plurality of vias are exposed to a side surface of the substrate, and wherein when the plurality of high-frequency signal connectors are disposed in the plurality of high-frequency signal connector mounting portions, a ground of each of the plurality of high-frequency signal connectors is in contact with the end of the first ground layer, the end of the second ground layer, and the cutting surfaces of some of the plurality of vias that are exposed to the side surface of the substrate.

Each of the plurality of high-frequency signal lines may be formed in a straight line.

A width of each of the plurality of high-frequency signal lines may be the same as a width of the signal terminal of the high-frequency signal connector.

The plurality of high-frequency signal lines may have an identical length.

One of the plurality of high-frequency signal lines and one of the plurality of high-frequency signal connector mounting portions corresponding to the one of the plurality of high-frequency signal lines may be spaced apart from each other, and a gap between the high-frequency signal line and the high-frequency signal connector mounting portion may be determined so that impedance of the high-frequency signal line is approximately 50Ω.

When at least one via is provided in the substrate, the at least one via may be spaced apart from the plurality of high-frequency signal lines by a distance in that the at least one via does not affect impedance of each of the plurality of high-frequency signal lines.

The high-frequency signal receiving portion may be provided with a high-frequency signal receiving connector.

The plurality of high-frequency signal connectors may include a SMA connector.

According to an aspect of the present disclosure, the printed circuit board operates with a high frequency that may have a frequency above 5 Ghz.

According to an aspect of the present disclosure, the printed circuit board may have a substrate and having a substrate edge; a signal line capable of carrying a signal and formed on a first side of the of the substrate; a first connection mount formed on the first side of the substrate, with a first mount edge aligned with the substrate edge and spaced apart from the signaling line by a space; a second connection mount formed on the first side of the substrate, with a second mount edge aligned with the substrate edge and spaced apart from the signaling line by the space; a ground layer formed on a second side of the substrate and having a ground layer edge aligned with the substrate edge; and conductors respectively embedded in the edge of the substrate, the edge of the ground layer, the edge of the first connection mount and the edge of the second connection mount, contacting the first connection mount and the second connection mount and the ground layer, and having exposed surfaces respectively aligned with the edge of the first connection mount, the edge of second connection mount, the edge of the substrate and the edge of the ground layer.

According to an aspect of the present disclosure, the printed circuit board may have the signal line carry the signal having a frequency greater than 5 GHz.

According to an aspect of the present disclosure, the printed circuit board may have the space produce an impedance in the signal line of approximately 50 Ohms and an approximately linear insertion loss.

According to an aspect of the present disclosure, the printed circuit board may have a connector providing a signal with a frequency greater than 5 GHz is connectable to the connection mount and located on the edge of the first connection mount, the edge of the substrate and the edge of the ground layer.

According to an aspect of the present disclosure, the printed circuit board may have the edge of the substrate, the edge of the ground layer, the edge of the first connection mount and the edge of the second connection mount have vias in which the conductors are formed.

According to an aspect of the present disclosure, a printed circuit board may have a substrate and having a substrate edge; a signal line capable of carrying a signal, formed on a first side of the of the substrate; a connection mount formed on the first side of the substrate, having a mount edge with the mount the edge aligned with the substrate edge and spaced apart from the signaling line by a space; a ground layer formed on a second side of the substrate and having a ground layer edge aligned with the substrate edge; and a conductor embedded in the edge of the substrate, the edge of the ground layer, and the edge of the mount, contacting the connection mount and the ground layer, and having an exposed surface aligned with the edge of the mount, the edge of the substrate and the edge of the ground layer.

According to an aspect of the present disclosure, a printed circuit board may have a substrate and having a substrate edge and a substrate via formed in the substrate edge; a signal line capable of carrying a signal, formed on a first side of the of the substrate; a connection mount formed on the first side of the substrate, having a mount edge with the mount the edge aligned with the substrate edge, spaced apart from the signaling line by a space and having a mount via formed in the mount edge; a ground layer formed on a second side of the substrate, having a ground layer edge aligned with the substrate edge and having a ground via formed in the ground layer; and a conductor embedded in the mount via, the substrate via and the ground via and having an exposed surface aligned with the mount edge, the substrate edge and ground layer edge.

According to an aspect of the present disclosure, a printed circuit board may have a substrate having a substrate edge; a ground layer formed on a first side of the substrate and having a ground edge flush with the substrate edge; a connector mount formed on a second side of the substrate and having a mount edge flush with the substrate edge; and a conductor connected between the ground layer and the mount, formed embedded in the mount edge, the ground layer edge and the substrate edge, and flush with the mount edge, the substrate edge and the ground edge.

According to an aspect of the present disclosure, a method of producing a printed circuit board, may provide a substrate having a substrate edge; form a ground layer on a first side of the substrate and having a ground edge flush with the substrate edge; form a connector mount on a second side of the substrate and having a mount edge flush with the substrate edge; and form a conductor between the ground layer and the mount, embedded in the mount edge, the ground layer edge and the substrate edge, and flush with the mount edge, the substrate edge and the ground edge.

According to an aspect of the present disclosure, the method may form a signal line on the substrate with a space between the connector mount and the signal line; attach a connector to the substrate edge, the mount edge and the ground edge; and provide a signal having a frequency greater than 5 GHz to the signal line via the connector.

According to an aspect of the present disclosure, the method may provide the space to produce an impedance of approximately 50 Ohms and an approximately linear insertion loss.

Other objects, advantages and salient features of the present disclosure will become apparent from the following detailed description, which, taken in conjunction with the annexed drawings, discloses preferred embodiments.

BRIEF DESCRIPTION OF THE DRAWINGS

These and/or other aspects and advantages of the present disclosure will become apparent and more readily appreciated from the following description of the embodiments, taken in conjunction with the accompanying drawings of which.

Throughout the drawings, like reference numerals will be understood to refer to like parts, components and structures

DETAILED DESCRIPTION

Figure 1:
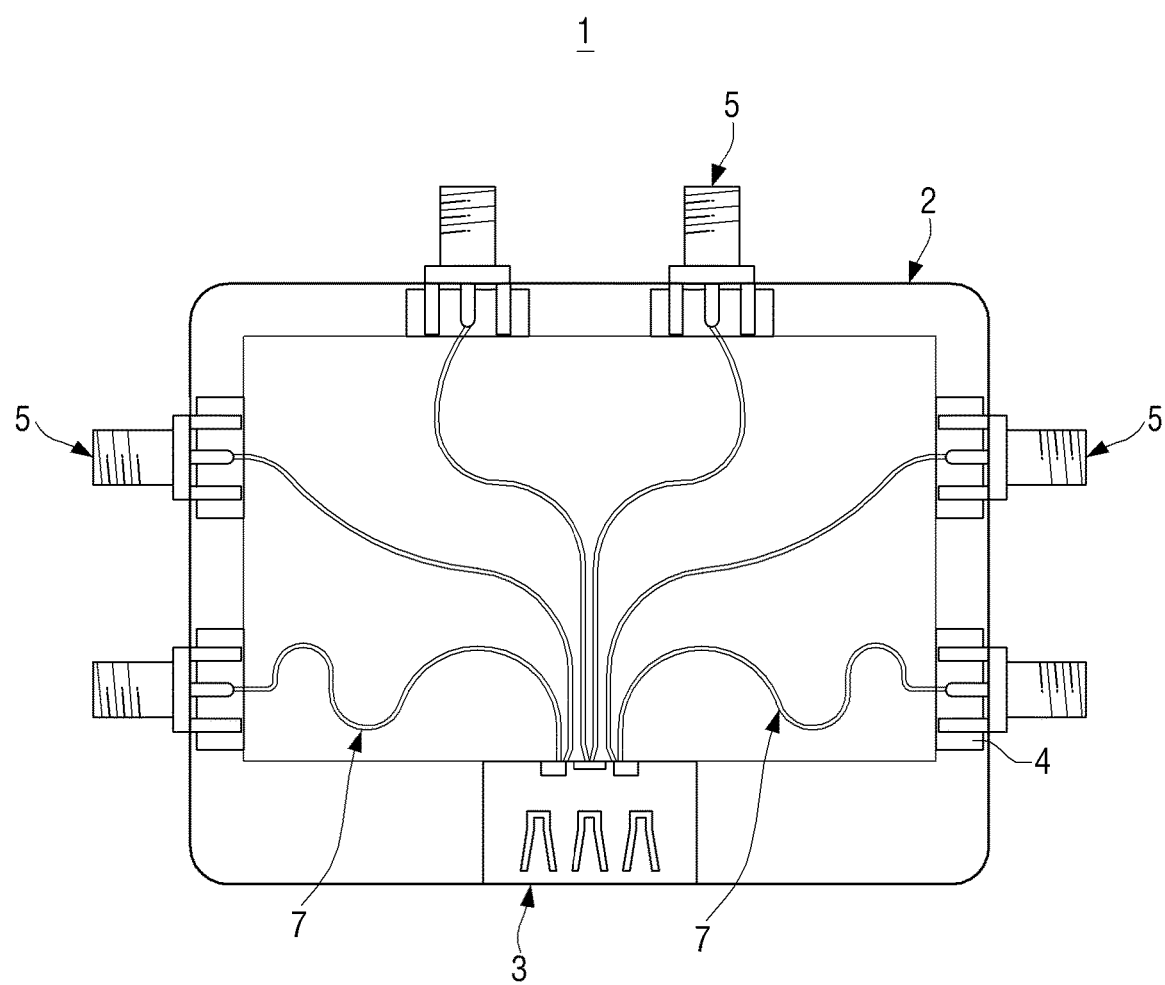
FIG. 1 is a view illustrating a conventional printed circuit board for signal branches.

Reference will now be made in detail to the embodiments, examples of which are illustrated in the accompanying drawings, wherein like reference numerals refer to the like elements throughout. The embodiments are described below by referring to the figures.

Hereinafter, certain exemplary embodiments of the present disclosure will be described in detail with reference to the accompanying drawings.

The matters defined herein, such as a detailed construction and elements thereof, are provided to assist in a comprehensive understanding of this description. Thus, it is apparent that exemplary embodiments may be carried out without those defined matters. Also, well-known functions or constructions are omitted to provide a clear and concise description of exemplary embodiments. Further, dimensions of various elements in the accompanying drawings may be arbitrarily increased or decreased for assisting in a comprehensive understanding.

The terms "first", "second", etc. may be used to describe diverse components, but the components are not limited by the terms. The terms are only used to distinguish one component from the others.

The terms used in the present application are only used to describe the exemplary embodiments, but are not intended to limit the scope of the disclosure. The singular expression also includes the plural meaning as long as it does not differently mean in the context. In the present application, the terms "include" and "consist of" designate the presence of features, numbers, steps, operations, components, elements, or a combination thereof that are written in the specification, but do not exclude the presence or possibility of addition of one or more other features, numbers, steps, operations, components, elements, or a combination thereof.

Figure 2:
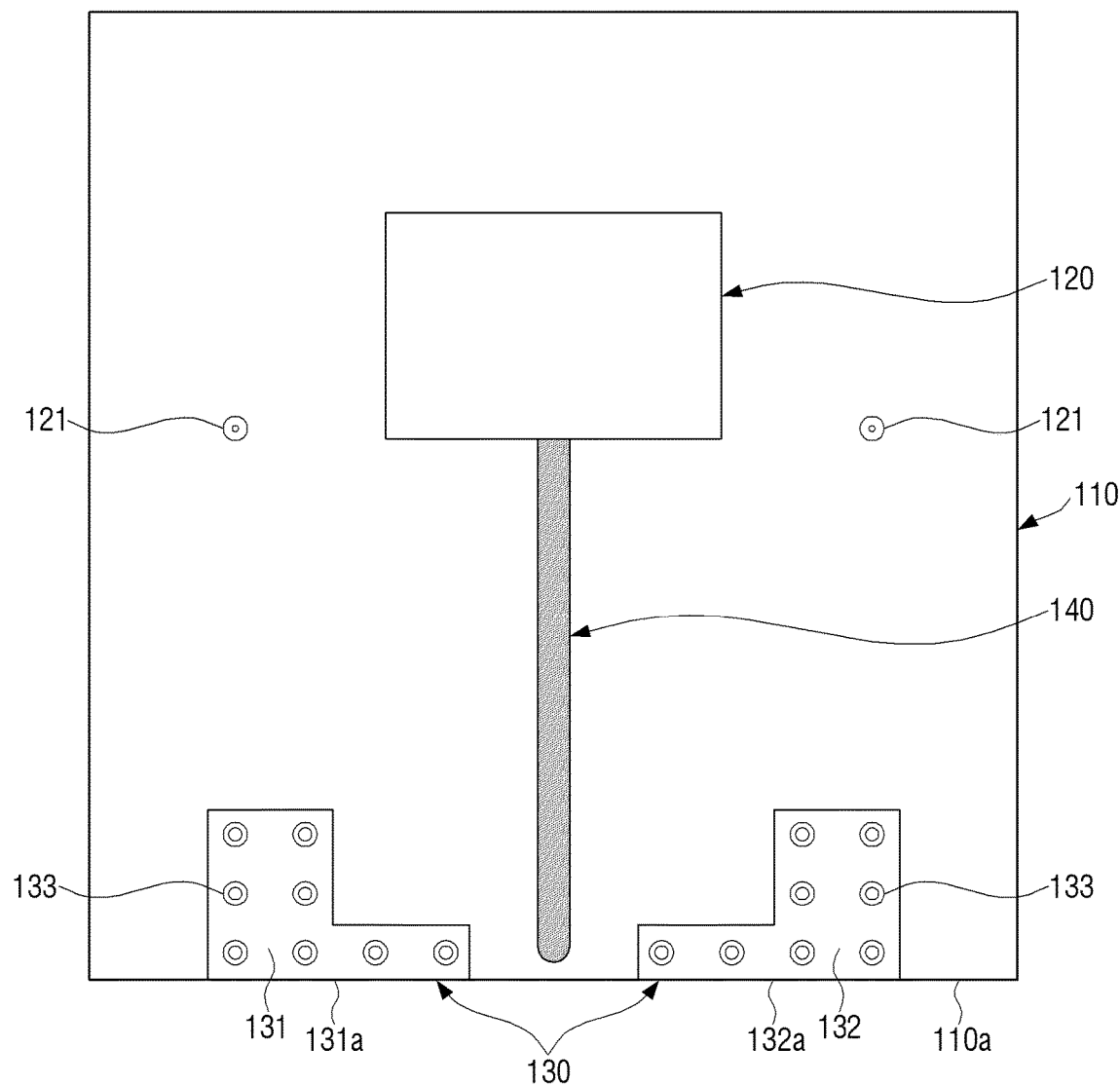
FIG. 2 is a view illustrating a printed circuit board having a high-frequency signal connector according to an embodiment of the present disclosure.
Figure 3A:
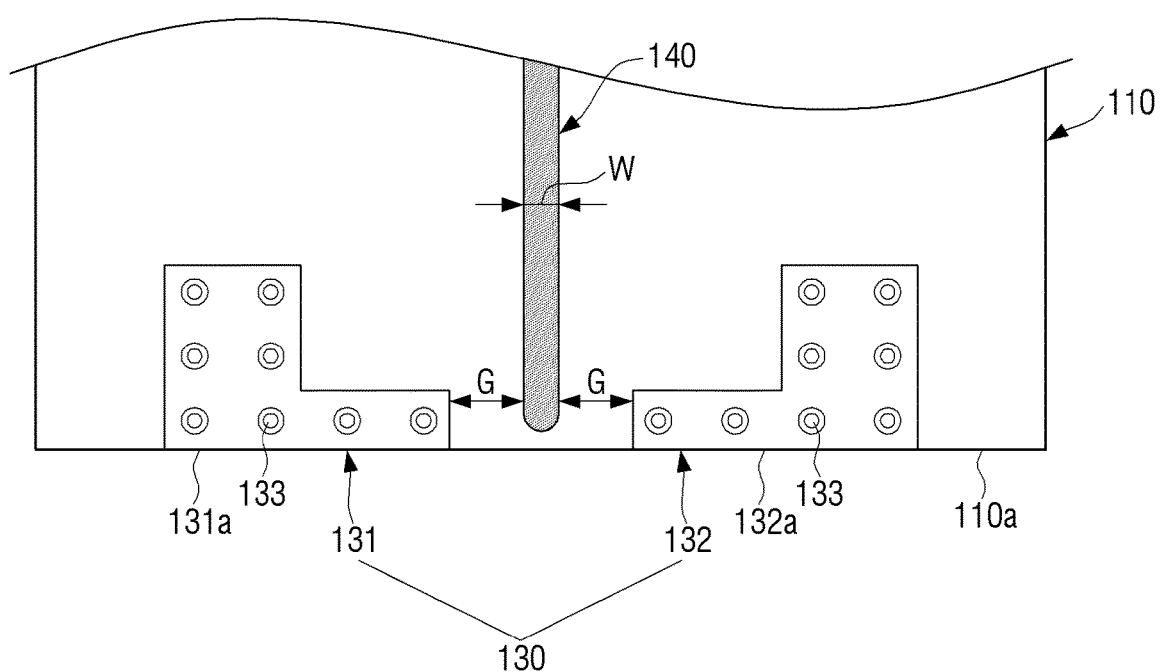
FIGS. 3A and 3B are partial views illustrating a high-frequency signal connector mounting portion of a printed circuit board having a high-frequency signal connector according to an embodiment of the present disclosure in which a high-frequency signal connector is disposed.
Figure 3B:
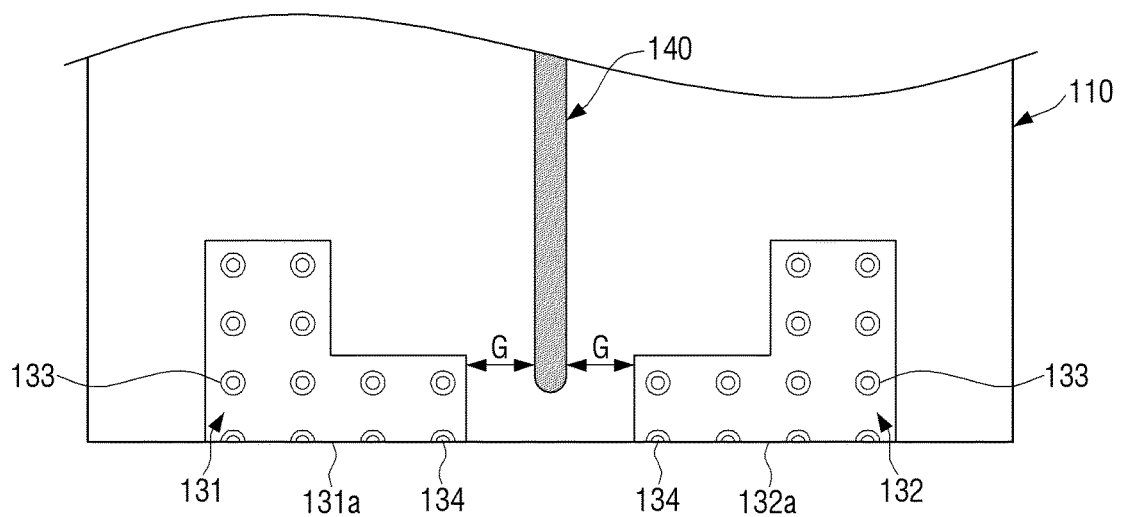
Figure 4A:
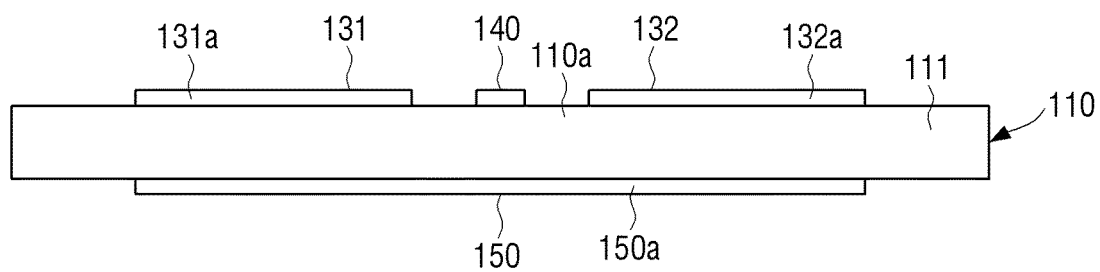
FIGS. 4A and 4B are front views illustrating the printed circuit board having a high-frequency signal connector of FIGS. 3A and 3B.
Figure 4B:
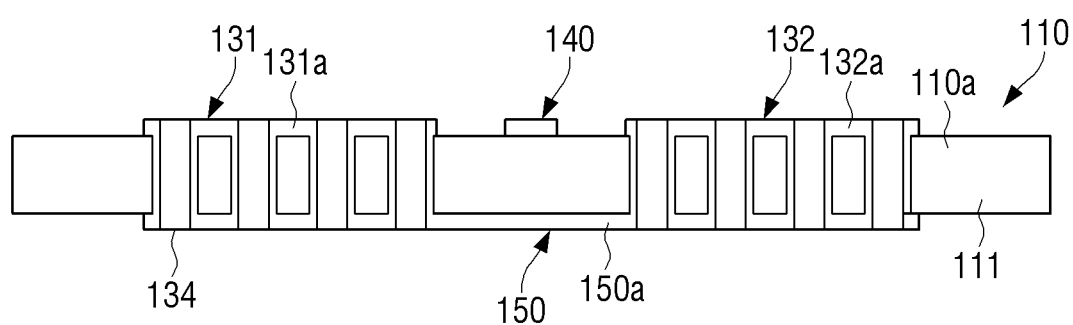

FIG. 2 is a view illustrating a printed circuit board having a high-frequency signal connector according to an embodiment of the present disclosure. FIGS. 3A and 3B are partial views illustrating a high-frequency signal connector mounting portion of a printed circuit board having a high-frequency signal connector according to an embodiment of the present disclosure in which a high-frequency signal connector is disposed. FIGS. 4A and 4B are front views illustrating the printed circuit board having a high-frequency signal connector of FIGS. 3A and 3B.

Referring to FIGS. 2 to 4B, a printed circuit board having a high-frequency signal connector 100 according to an embodiment of the present disclosure may include a substrate 110, a high-frequency signal generation part 120, a high-frequency signal connector mounting portion 130, and a high-frequency signal line 140.

The substrate 110 may include two layers, that is, a surface layer and a ground layer 150. In detail, as illustrated in FIGS. 4A and 4B, the substrate 110 is formed in a structure in which the ground layer 150, an insulating layer 111, and the surface layer are laminated in sequence. The insulating layer 111 is formed by using FR-4, a type of glass epoxy laminate. The surface layer and the ground layer 150 are formed of a metal such as copper having a good electrical conductivity. The surface layer is formed of a copper foil on a top surface of the substrate 110. The surface layer may include the high-frequency signal generation part 120, the high-frequency signal connector mounting portion 130, and the high-frequency signal line 140.

The high-frequency signal generation part 120 is provided on the surface of the substrate 110, and may be implemented as an electronic circuit capable of generating high-frequency signals, for example, high-frequency signals of more than 5 GHz. In FIG. 2, the specific electronic circuit of the high-frequency signal generation part 120 is not illustrated; however, the high-frequency signal generation part 120 may include electronic components that can generate high-frequency signals and transmit the high-frequency signals to the high-frequency signal line 140.

As another example, the high-frequency signal generation part 120 may be implemented as a connector capable of transmitting high-frequency signals that is disposed on the surface of the substrate 110. The connector is formed to be able to deliver the high-frequency signals without loss.

The high-frequency signal connector mounting portion 130 is provided on the surface of the substrate 110, and is formed in contact with one side surface of the substrate 110. The high-frequency signal connector mounting portion 130 may include a left high-frequency signal connector mounting portion 131 and a right high-frequency signal connector mounting portion 132 that are provided on the left and right of the high-frequency signal line 140. A high-frequency signal connector 50 (see FIG. 8) is disposed in the high-frequency signal connector mounting portion 130. Accordingly, the high-frequency signal connector mounting portion 130 is formed corresponding to the shape of a fixing portion 55 of the high-frequency signal connector 50 so that the high-frequency signal connector 50 is fixed to the high-frequency signal connector mounting portion 130 by soldering.

The high-frequency signal connector mounting portion 130 may be provided with a connecting portion that is electrically connected to the ground layer 150 provided on the bottom surface of the substrate 110. The connecting portion may be formed in various ways as long as it can electrically connect the high-frequency signal connector mounting portion 130 and the ground layer 150. In the present embodiment, a plurality of vias 133 that penetrate or are embedded in the substrate 110 up to the ground layer 150 on the bottom surface of the substrate 110 are formed in the high-frequency signal connector mounting portion 130 as the connecting portion. The plurality of vias 113 electrically connect the high-frequency signal connector mounting portion 130 and the ground layer 150. Solder may be filled inside the plurality of vias 133 and made flush with the edges of the substrate 110 and ground layer 150.

As illustrated in FIG. 3A, the high-frequency signal connector mounting portion 130 is extended to a side surface 110a of the substrate 110. In other words, there is no gap between the side surface 110a of the substrate 110 and ends 131a and 132a of the left and right high-frequency signal connector mounting portions 131 and 132 so that the side surface 110a of the substrate 110 is matched with the ends 131a and 132a of the left and right high-frequency signal connector mounting portions 131 and 132. At this time, an end 150a of the ground layer 150 provided on the bottom surface of the substrate 110 is also formed to be matched with the side surface 110a of the substrate 110. Accordingly, when the high-frequency signal connector 50 is disposed in the high-frequency signal connector mounting portion 130, a base 54 of the high-frequency signal connector 50 is directly in contact with the ends 131a and 132a of the left and right high-frequency signal connector mounting portions 131 and 132 and the end 150a of the ground layer 150. Also, two upper fixing protrusions 56 and two lower fixing protrusions 57 projecting from the base 54 of the high-frequency signal connector 50 are fixed to the high-frequency signal connector mounting portion 130 and the ground layer 150 by soldering, respectively.

As another example, when the high-frequency signal connector mounting portion 130 is provided with the connecting portion connected to the ground layer 150, a cross-section of the connecting portion may be formed to be exposed to the one side surface 110a of the substrate 110.

For example, when the high-frequency signal connector mounting portion 130 is provided with the plurality of vias 133 as the connecting portion, as illustrated in FIGS. 3B and 4B, cutting surfaces 134 of the plurality of vias 133 that are formed parallel to each other are exposed to the one side surface 110a of the substrate 110. In the case in which the cutting surfaces 134 of the plurality of vias 133 are exposed to the one side surface 110a of the substrate 110 as described above, when the high-frequency signal connector 50 is disposed in the high-frequency signal connector mounting portion 130, the base 54 of the high-frequency signal connector 50 is directly in contact with the ends 131a and 132a of the left and right high-frequency signal connector mounting portions 131 and 132, the end 150a of the ground layer 150, and the cutting surfaces 134 of the plurality of vias 133. Also, when the upper fixing protrusions 56 of the high-frequency signal connector 50 are fixed to the left and right high-frequency signal connector mounting portions 131 and 132 by soldering, solder is inserted into the holes of the plurality of cut vias 133 so that the base 54 of the high-frequency signal connector 50 is secured to the side surface 110a of the substrate 110 by soldering (see FIG. 9B). Accordingly, the high-frequency signal connector 50 may be more rigidly fixed to the substrate 110. Also, the ground of high-frequency signal connector 50 and the plurality of cut vias 133 are connected by the solder filled in the plurality of cut vias 133.

Figure 5:
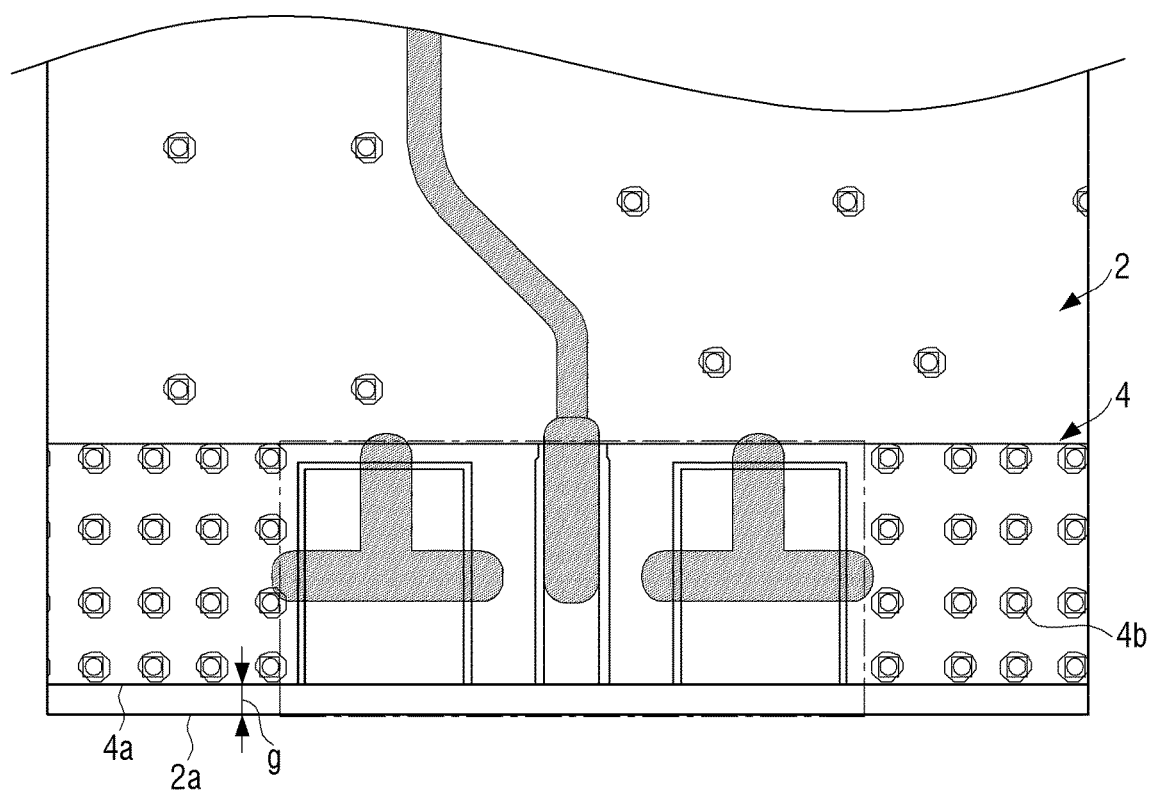
FIG. 5 is a partial view illustrating a high-frequency signal connector mounting portion of a conventional printed circuit board in which an SMA connector is disposed.

FIG. 5 illustrates a high-frequency signal connector mounting portion of a conventional printed circuit board.

Referring to FIG. 5, there is a certain gap G between an end 4a of a high-frequency signal connector mounting portion 4 of a conventional printed circuit board 2 and a side surface 2a of the printed circuit board 2. In the conventional printed circuit board 2, FR-4 of the insulating layer forming the printed circuit board 2 is exposed to the side surface 2a of the printed circuit board 2, and the high-frequency signal connector mounting portion 4, the ground layer, and the plurality of vias 4b are not exposed to the side surface 2a of the printed circuit board 2. Accordingly, when a SMA connector 5, the high-frequency signal connector is disposed in the high-frequency signal connector mounting portion 4, the upper fixing protrusions projecting from the base of the connector 5 are fixed to the high-frequency signal connector mounting portion 4 by soldering, and the lower fixing protrusions are fixed to the ground layer by the soldering. However, the base of the high-frequency signal connector 5 is blocked by the insulating layer so as not to be in contact with the high-frequency signal connector mounting portion 4 and the ground layer. Therefore, the conventional printed circuit board 2 is different from the printed circuit board having a high-frequency signal connector 100 according to an embodiment of the present disclosure as illustrated in FIGS. 2 to 4B.

Referring back to FIGS. 2 to 4B, the high-frequency signal line 140 is formed on the surface layer of the substrate 110, and is extended from the high-frequency signal generation part 120 to the high-frequency signal connector mounting portion 130. In detail, the high-frequency signal line 140 is extended between the left and right high-frequency signal connector mounting portions 131 and 132. An end portion of the high-frequency signal line 140 adjacent to the left and right high-frequency signal connector mounting portions 131 and 132 is spaced apart a predetermined distance G so as not to contact with the left and right high-frequency signal connector mounting portions 131 and 132. A width W of the high-frequency signal line 140 may be formed to be the substantially same as a diameter or a width of a signal terminal 58 of the high-frequency signal connector 50. For example, when the diameter of the signal terminal 58 of the SMA connector used as the high-frequency signal connector 50 is 0.5 mm, the width W of the high-frequency signal line 140 is formed in 0.5 mm.

Also, the high-frequency signal line 140 is formed in a straight line. When the high-frequency signal line 140 is formed in a straight line, deviation in impedance may be minimized. In general, when the printed circuit board 110 is produced, patterns such as the high-frequency signal line 140 are formed by using an etching process. When the high-frequency signal line 140 is formed by the etching process, the width W of the high-frequency signal line 140 becomes more uniform when the high-frequency signal line 140 is formed in the straight line than when the high-frequency signal line 140 is formed in a curved line. Accordingly, when the high-frequency signal line 140 is formed in the straight line, deviation in impedance of the high-frequency signal line 140 may be minimized.

Also, the ground adjacent to the high-frequency signal line 140 may generate capacitance component, thereby giving an adverse effect on the impedance of the high-frequency signal line 140. In order to minimize the adverse effect, the left and right high-frequency signal connector mounting portions 131 and 132 may be disposed to be spaced apart a predetermined distance G from the high-frequency signal line 140. The distance G between the high-frequency signal line 140 and each of the left and right high-frequency signal connector mounting portions 131 and 132 may be determined so that the impedance of the high-frequency signal line 140 becomes the necessary impedance. For example, when the impedance of an original transmission line is 50Ω (ohms), the distance G may be determined so that the impedance of the high-frequency signal line 140 becomes about 50Ω (ohms). As another example, when the impedance of an original transmission line is 40Ω or 75Ω, the distance G may be determined so that the impedance of the high-frequency signal line 140 becomes about 40Ω or about 75Ω.

The substrate 110 may be provided with at least one via for connecting the ground layer 150 on the bottom surface of the substrate 110 in addition to the plurality of vias 133 provided in the above-described high-frequency signal connector mounting portion 130. For example, at least one via 121 penetrating the substrate 110 may be provided depending on the electronic circuit constituting the high-frequency signal generation part 120. At this time, since a capacitance may occur between the via 121 and the high-frequency signal line 140, and the via 121 may affect the impedance of the high-frequency signal line 140. Accordingly, when forming the at least one via 121 in the substrate 110, it is necessary to form the at least one via 121 away from the high-frequency signal line 140 by a distance in that the at least one via 121 does not affect the impedance of the high-frequency signal line 140.

Figure 8:
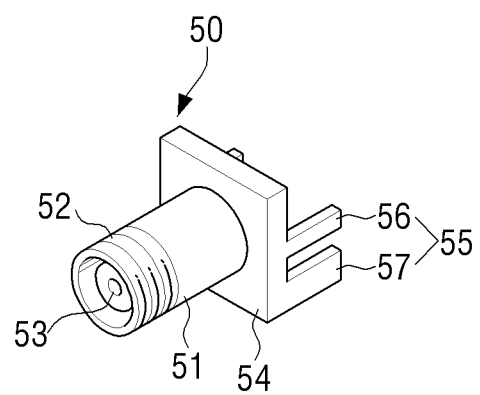
FIG. 8 is a perspective view illustrating an SMA connector, a high-frequency signal connector that is used in a printed circuit board having a high-frequency signal connector according to an embodiment of the present disclosure.

The high-frequency signal connector 50 is disposed in the above-described high-frequency signal connector mounting portion 130. The printed circuit board 100 according to an embodiment of the present disclosure uses an SMA connector as illustrated in FIG. 8 as the high-frequency signal connector 50. The SMA connector 50 is connected to a coaxial cable having a single signal line. A center signal terminal 58 of the SMA connector 50 is connected to the high-frequency signal line 140. The signal terminal 58 of the SMA connector 50 is connected to the high-frequency signal line 140 by the soldering. The base 54 of the SMA connector 50 is in contact with the ground layer 150 exposed to the side surface 110*a* of the substrate 110, the upper fixing protrusion 56 projecting from the base 54 is fixed to the high-frequency signal connector mounting portion 130 provided on the top surface of the substrate 110, and the lower fixing protrusions 57 projecting from the base 54 are fixed to the ground layer 150 provided on the bottom surface of the substrate 110.

The printed circuit board having a high-frequency signal connector 100 according to an embodiment of the present disclosure having the above-described configuration may be used for the high-frequency signal transmission because the impedance of the high-frequency signal line 140 is maintained about 50Ω and the insertion-loss of S-parameter is reduced linearly.

Hereinafter, a printed circuit board having a high-frequency signal connector according to another embodiment of the present disclosure will be described with reference to FIGS. 6 and 7.

Figure 6:
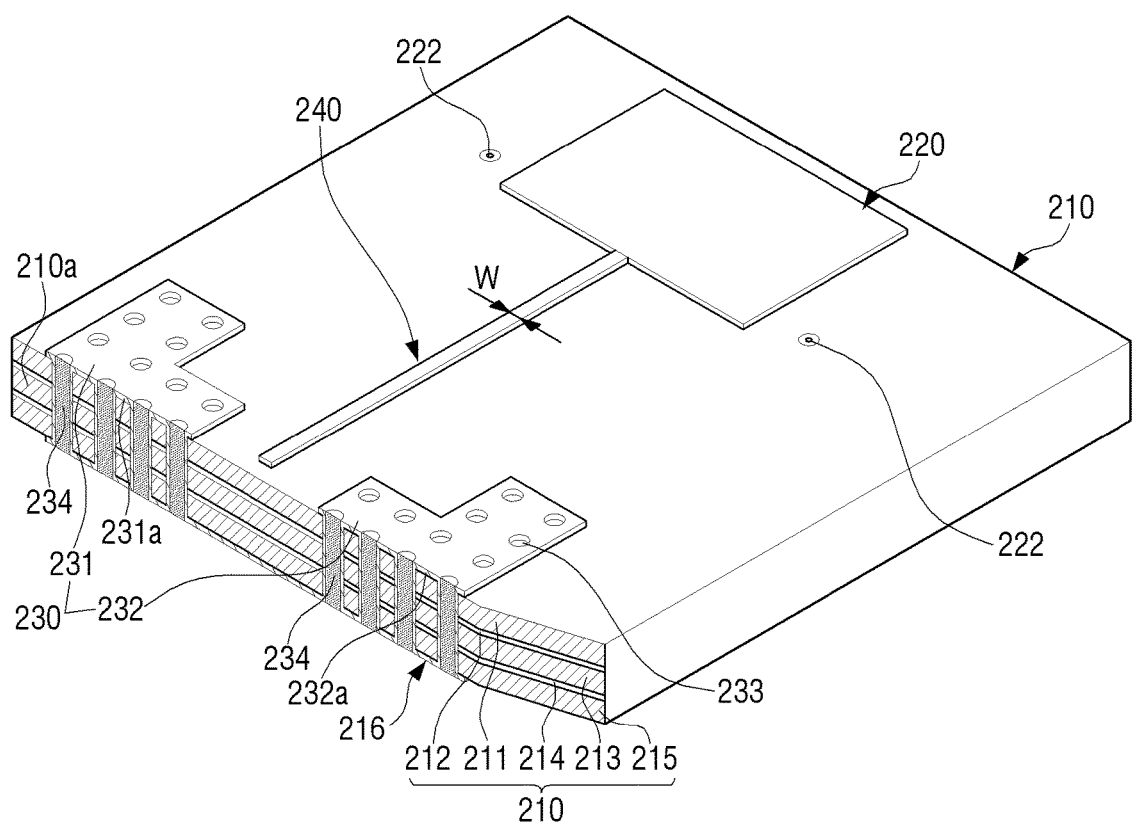
FIG. 6 is a perspective view illustrating a printed circuit board having a high-frequency signal connector according to another embodiment of the present disclosure.
Figure 7:
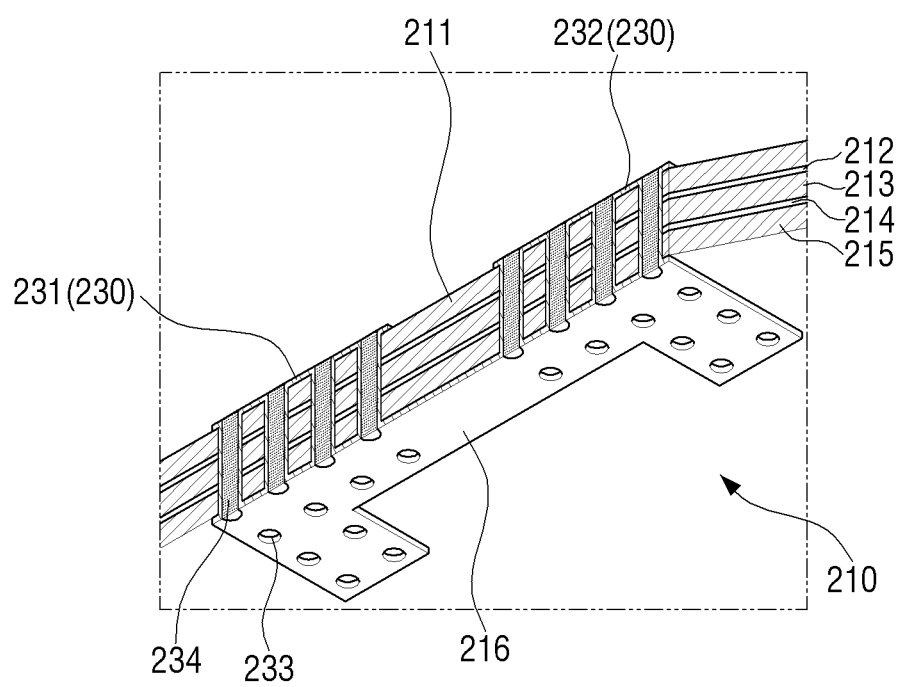
FIG. 7 is a partial bottom perspective view illustrating a high-frequency signal connector mounting portion of the printed circuit board of FIG. 6 in which the high-frequency signal connector is disposed.

FIG. 6 is a perspective view illustrating a printed circuit board having a high-frequency signal connector according to another embodiment of the present disclosure, and FIG. 7 is a partial bottom perspective view illustrating a high-frequency signal connector mounting portion of the printed circuit board of FIG. 6 in which the high-frequency signal connector is disposed.

Referring to FIGS. 6 and 7, a printed circuit board having a high-frequency signal connector 200 according to an embodiment of the present disclosure may include a substrate 210, a high-frequency signal generation part 220, a high-frequency signal connector mounting portion 230, and a high-frequency signal line 240.

The substrate 210 includes four layers, that is, a surface layer, a first ground layer 212, a second ground layer 214, and a bottom layer 216. In detail, as illustrated in FIGS. 6 and 7, the substrate 210 is formed in a structure in which the bottom layer 216, a third insulating layer 215, the second ground layer 214, a second insulating layer 213, the first ground layer 212, a first insulating layer 211, and the surface layer are laminated in sequence. The first insulating layer 211, the second insulating layer 213, and the third insulating layer 215 are manufactured by using the FR-4, a type of glass epoxy laminate. The surface layer, the first and second ground layers 212 and 214, and the bottom layer 216 are formed of a metal such as copper having a good electrical conductivity.

The surface layer is formed of a copper foil on a top surface of the substrate 210, in detail, a surface of the first insulating layer 211. The surface layer may include the high-frequency signal generation part 220, the high-frequency signal connector mounting portion 230, and the high-frequency signal line 240. The high-frequency signal generation part 220, the high-frequency signal connector mounting portion 230, and the high-frequency signal line 240 may be formed by etching the copper foil provided on the surface of the first insulating layer The high-frequency signal generation part 220 is provided on the surface of the substrate 210, in detail, on the surface of the first insulating layer 211, and may be implemented in an electronic circuit capable of generating high-frequency signals, for example, signals of more than 5 GHz. In FIG. 6, the specific electronic circuit of the high-frequency signal generation part 220 is not illustrated; however, the high-frequency signal generation part 220 may include electronic components that generates high-frequency signals and transmits the high-frequency signals to the high-frequency signal line 240.

As another example, the high-frequency signal generation part 220 may be implemented as a connector capable of transmitting high-frequency signals that is disposed on the surface of the substrate 210. The connector is formed to be able to deliver the high-frequency signals, which are transmitted through a cable from other electronic device, without loss.

The high-frequency signal connector mounting portion 230 is provided on the surface of the substrate 210, in detail, the surface of the first insulating layer 211, and is formed in contact with one side surface 210*a* of the substrate 210. A high-frequency signal connector 50 (see FIG. 8) is disposed in the high-frequency signal connector mounting portion 230. Accordingly, the high-frequency signal connector mounting portion 230 is formed corresponding to the shape of a fixing portion 55 of the high-frequency signal connector 50 so that the high-frequency signal connector 50 is fixed to the high-frequency signal connector mounting portion 230 by soldering.

The high-frequency signal connector mounting portion 230 may be provided with a plurality of vias 233. The plurality of vias 233 are formed to penetrate the first insulating layer 211, the first ground layer 212, the second insulating layer 213, the second ground layer 214, the third insulating layer 215, and the bottom layer 216 below the high-frequency signal connector mounting portion 230 in the thickness direction of the substrate 210. The plurality of vias 233 electrically connect the high-frequency signal connector mounting portion 230, the first and second ground layers 212 and 214, and the bottom layer 216. Solder may be filled inside the plurality of vias 233.

As illustrated in FIG. 6, the high-frequency signal connector mounting portion 230 may include a left high-frequency signal connector mounting portion 231 and a right high-frequency signal connector mounting portion 232 that are provided on the left and right of the high-frequency signal line 240. The left and right high-frequency signal connector mounting portions 231 and 232 are extended to the side surface 210*a* of the substrate 210. In other words, there is no gap between the side surface 210*a* of the substrate 210 and ends 231*a* and 232*a* of the left and right high-frequency signal connector mounting portions 231 and 232 so that the side surface 210*a* of the substrate 210 is matched with the ends 231*a* and 232*a* of the left and right high-frequency signal connector mounting portions 231 and 232. At this time, an end of each of the first ground layer 212, the second ground layer 214, and the bottom layer 216 provided below the high-frequency signal connector mounting portion 230 is also formed to be matched with the side surface 210*a* of the substrate 210. Accordingly, when the high-frequency signal connector 50 is disposed in the high-frequency signal connector mounting portion 230, a base 54 of the high-frequency signal connector 50 is directly in contact with the ends 231*a* and 232*a* of the left and right high-frequency signal connector mounting portions 231 and 232, the end of the first ground layer 212, the end of the second ground layer 214, and the end of the bottom layer 216. Also, two upper fixing protrusions 56 and two lower fixing protrusions 57 projecting from the base 54 of the high-frequency signal connector 50 are fixed to the high-frequency signal connector mounting portion 230 and the bottom layer 216 by soldering, respectively.

At this time, as illustrated in FIGS. 6 and 7, when the high-frequency signal connector mounting portion 230 is provided with the plurality of vias 233 that penetrate the substrate 210, the cutting surfaces 234 of the plurality of vias 233 that are formed parallel to each other are exposed to the one side surface 210a of the substrate 210. In the case in which the cutting surfaces 234 of the plurality of vias 233 are exposed to the one side surface 210a of the substrate 210 as described above, when the high-frequency signal connector 50 is disposed in the high-frequency signal connector mounting portion 230, the base 54 of the high-frequency signal connector 50 is directly in contact with the ends 231a and 232a of the left and right high-frequency signal connector mounting portions 231 and 232, the end of the first ground layer 212, the end of the second ground layer 214, the end of the bottom layer 216, and the cutting surfaces 234 of the plurality of vias 233. Also, when the upper fixing protrusions 56 of the high-frequency signal connector 50 are fixed to the high-frequency signal connector mounting portion 230 by soldering, solder is inserted into the holes of the plurality of cut vias 233 so that the base 54 of the high-frequency signal connector 50 is secured to the side surface 210a of the substrate 210 by the soldering. Accordingly, the high-frequency signal connector 50 may be more rigidly fixed to the substrate 210.

The first ground layer 212 is formed to cover entirely the upper surface of the second insulating layer 213, and forms a return path of the high-frequency signal passing through the high-frequency signal line 240. An end of a portion of the first ground layer 212 corresponding to the high-frequency signal connector mounting portion 230 is formed to be exposed to the side surface 210a of the substrate 210 with which the high-frequency signal connector mounting portion 230 is in contact. Since the first ground layer 212 is directly in contact with and connected to the base 54 of the high-frequency signal connector 50, when a high-frequency signal is transmitted through a signal terminal 58 of the high-frequency signal connector 50, the return path of the high-frequency signal is also connected to the ground of the high-frequency signal connector 50 without disconnection.

The second ground layer 214 is formed to cover entirely the upper surface of the third insulating layer 215. An end of a portion of the second ground layer 214 corresponding to the high-frequency signal connector mounting portion 230 is formed to be exposed to the side surface 210a of the substrate 210 with which the high-frequency signal connector mounting portion 230 is in contact.

The bottom layer 216 is provided on the bottom surface of the third insulating layer 215, and is formed to secure the fixing portion 55 of the high-frequency signal connector 50 by soldering. The bottom layer 216 is formed to secure the lower fixing protrusions 57 of the fixing portion 55 of the high-frequency signal connector 50.

The high-frequency signal line 240 is formed on the surface of the substrate 210, in detail, the surface of the first insulating layer 211, and is extended from the high-frequency signal generation part 220 to between the left and right high-frequency signal connector mounting portions 231 and 232. An end portion of the high-frequency signal line 240 adjacent to the left and right high-frequency signal connector mounting portions 231 and 232 is spaced apart so as not to contact with the left and right high-frequency signal connector mounting portions 231 and 232, and the side surface 210a of the substrate 210. A width W of the high-frequency signal line 240 may be formed to be the substantially same as a diameter or a width of the signal terminal 58 of the high-frequency signal connector 50. Also, the high-frequency signal line 140 is formed in a straight line so that the deviation in impedance may be minimized.

Also, the ground adjacent to the high-frequency signal line 240 may generate capacitance component, thereby giving an adverse effect on the impedance of the high-frequency signal line 240. In order to minimize the adverse effect, the left and right high-frequency signal connector mounting portions 231 and 232 may be spaced apart a predetermined distance G from the high-frequency signal line 240. At this time, the distance G between the high-frequency signal line 240 and each of the left and right high-frequency signal connector mounting portions 231 and 232 may be determined so that the impedance of the high-frequency signal line 240 is about 50Ω.

The substrate 210 may be provided with at least one via for connecting the first and second ground layers 212 and 214 in addition to the above-described plurality of vias 233 provided in the high-frequency signal connector mounting portion 230. For example, at least one via 222 may be provided for an electronic circuit constituting the high-frequency signal generation part 220. At this time, since capacitance component may occur between the at least one via 222 and the high-frequency signal line 240, the at least one via 222 may affect the impedance of the high-frequency signal line 240. Accordingly, when forming the at least one via 222 in the substrate 210, it is necessary to form the at least one via 222 away from the high-frequency signal line 240 by a distance in that the at least one via 222 does not affect the impedance of the high-frequency signal line 240. However, if possible, it may not form the at least one via 222 in the vicinity of the high-frequency signal line 240.

The high-frequency signal connector 50 is disposed in the above-described high-frequency signal connector mounting portion 230. The printed circuit board 200 according to an embodiment of the present disclosure uses an SMA connector as an example of the high-frequency signal connector 50.

Hereinafter, an SMA connector 50 will be explained in detail with reference to FIGS. 8 and 9.

Figure 9A:
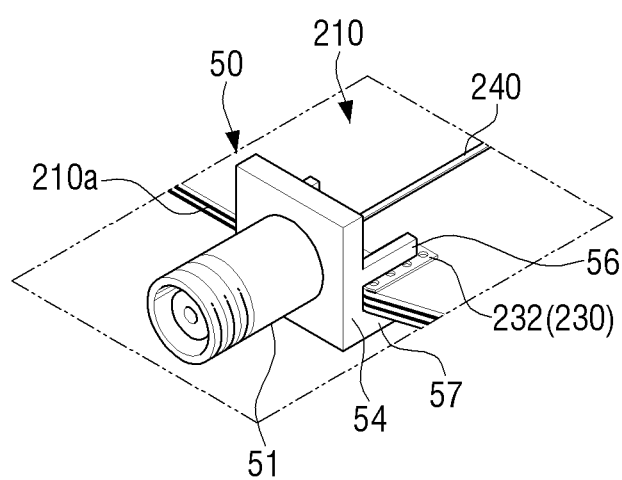
FIG. 9A is a partial perspective view illustrating the SMA connector of FIG. 8 which is disposed in a high-frequency signal connector mounting portion of a printed circuit board having a high-frequency signal connector according to an embodiment of the present disclosure.
Figure 9B:
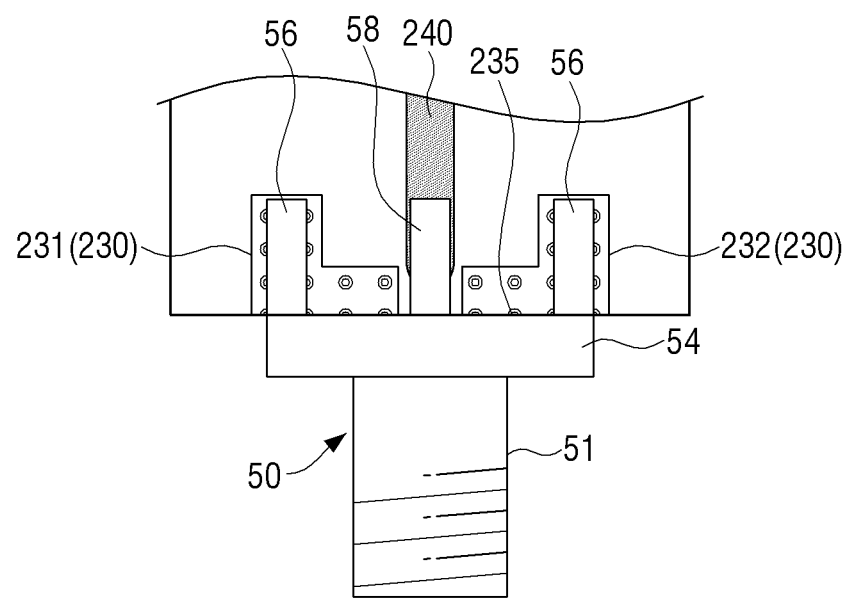
FIG. 9B is a partial plan view illustrating the high-frequency signal connector of FIG. 9A.

FIG. 8 is a perspective view illustrating an SMA connector, a high-frequency signal connector that is used in a printed circuit board having a high-frequency signal connector according to an embodiment of the present disclosure. FIG. 9A is a partial perspective view illustrating a SMA connector of FIG. 8 which is disposed in a high-frequency signal connector mounting portion of a printed circuit board having a high-frequency signal connector according to an embodiment of the present disclosure, and FIG. 9B is a partial plan view illustrating the high-frequency signal connector of FIG. 9A.

Referring to FIG. 8, a SMA connector 50, a high-frequency signal connector that may be used in a printed circuit board having a high-frequency signal connector according to an embodiment of the present disclosure may include a base 54, a connecting portion 51, and a fixing portion 55.

The connecting portion 51 is formed in a cylindrical shape projecting from a side surface of the base 54, and a male screw 52 is formed on the outer surface of the connecting portion 51. A connecting hole 53 is formed in a center of the connecting portion 51. Accordingly, the SMA connector 50 is a female connector. Accordingly, when tightening a male SMA connector corresponding to the SMA connector 50, a high-frequency signal may be transmitted to the outside.

The fixing portion 55 is formed on the other side surface of the base 54, that is, on the opposite side to the connecting portion 51. The fixing portion 55 includes two upper fixing protrusions 56 and two lower fixing protrusions 57. As illustrated in FIG. 9A, the substrate 210 is inserted into between the upper fixing protrusions 56 and the lower fixing protrusions 57 of the SMA connector 50. The upper fixing protrusions 56 are connected to the high-frequency signal mounting portion 230 of the substrate 210 by soldering, and the lower fixing protrusions 57 are connected to the bottom layer 216 by soldering. When the upper fixing protrusions 56 and the lower fixing protrusions 57 of the SMA connector 50 are fixed to the substrate 210, the base 54 is in contact with the side surface 210a of the substrate 210. Accordingly, the base 54 is directly in contact with the end of high-frequency signal connector mounting portion 230, the end of the first ground layer 212, the second ground layer 214, the end of the bottom layer 216, and the cutting surfaces 234 of the plurality of vias 233 that are exposed to the side surface 210a of the substrate 210. The base 54, the upper fixing protrusions 56, and the lower fixing protrusions 57 of the SMA connector 50 are formed of a material having a good electrical conductivity. Accordingly, the base 54, the upper fixing protrusions 56, and the lower fixing protrusions 57 may function as a ground of the SMA connector 50, the high-frequency signal connector.

Also, the signal terminal 58 projects between the two upper fixing protrusions 56 toward the fixing portion 55. When the SMA connector 50 is secured to the high-frequency signal connector mounting portion 230 of the substrate 210, the signal terminal 58 is in contact with the high-frequency signal line 240. Accordingly, when the signal terminal 58 of the SMA connector 50 is fixed to the high-frequency signal line 240 by soldering, the high-frequency signal passing through the high-frequency signal line 240 may be transmitted to the outside through the SMA connector 50. At this time, since the first ground layer 212 that forms the return path of the high-frequency signal is directly in contact with and connected with the base 54 of the SMA connector 50, the return path is also continuously connected to the SMA connector 50 so that the high-frequency signals may be transmitted efficiently.

The printed circuit board having a high-frequency signal connector 200 according to an embodiment of the present disclosure having the above-described structure may be used for the high-frequency signal transmission because the impedance of the high-frequency signal line 240 is maintained about 50Ω and the insertion-loss of S-parameter is reduced linearly.

Even if the substrate 210 is a multi-layer substrate including four layers as described above, a printed circuit board having a high-frequency signal connector according to an embodiment of the present disclosure may be implemented.

In the above description, the substrate includes two layers or four layers. However, the number of the layers of the substrate is not limited thereto. The substrate may include three layers, or five or more layers.

Hereinafter, a case in that a printed circuit board having a high-frequency signal connector according to an embodiment of the present disclosure is implemented as a cable measuring jig capable of measuring the characteristics of a cable, for example, impedance, insertion-loss, etc. of the cable will be described.

Figure 10:
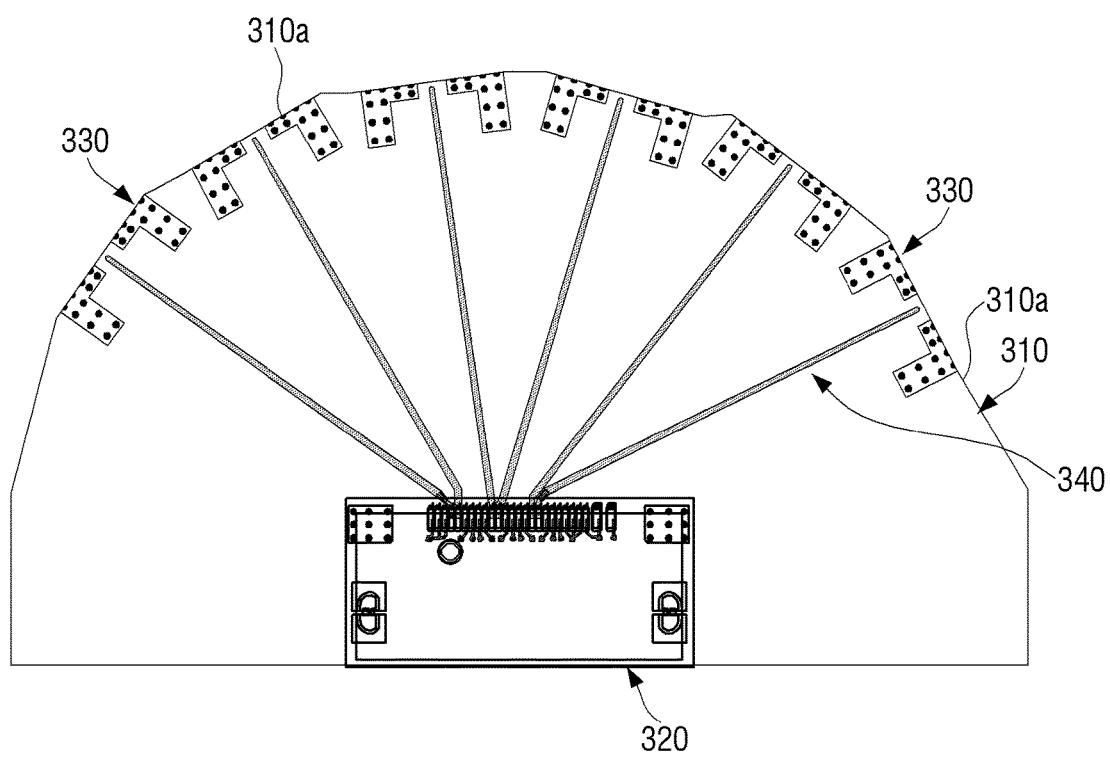
FIG. 10 is a view illustrating a cable measuring jig implemented by a printed circuit board having a high-frequency signal connector according to another embodiment of the present disclosure.
Figure 11:
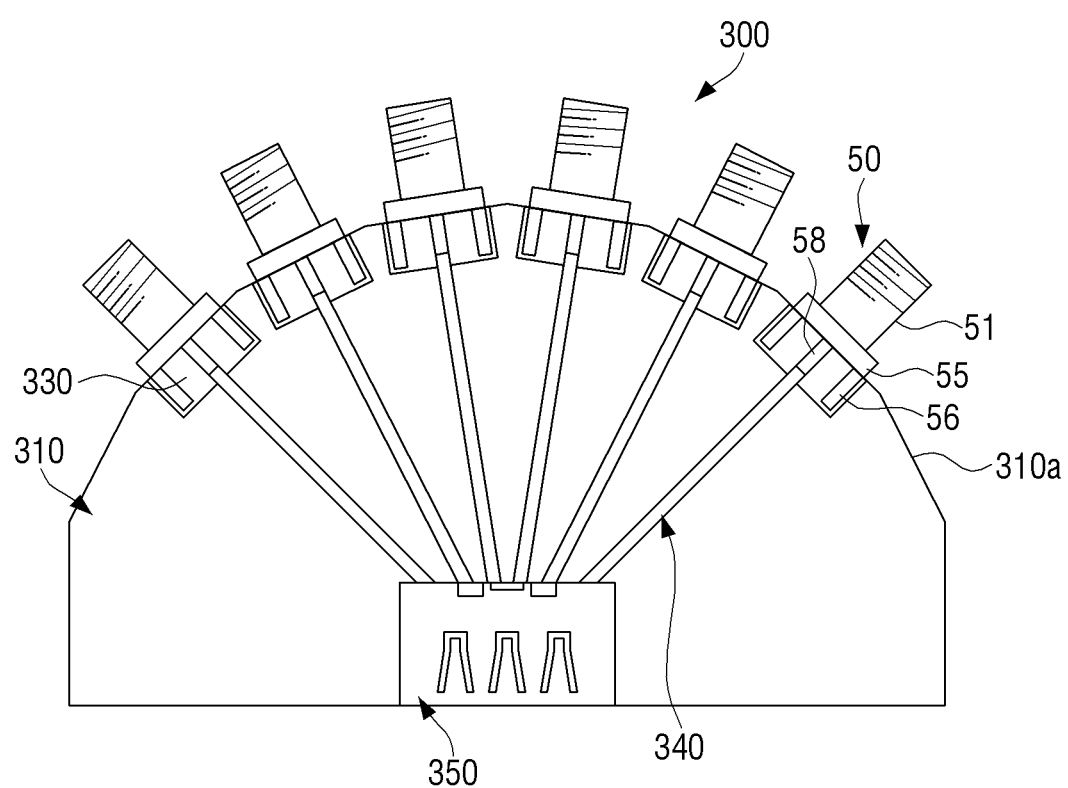
FIG. 11 is a view illustrating a state in which SMA connectors and a high-frequency signal connector are disposed on the printed circuit board of FIG. 10.

FIG. 10 is a view illustrating a cable measuring jig that is implemented by a printed circuit board having a high-frequency signal connector according to another embodiment of the present disclosure, and FIG. 11 is a view illustrating a state in which SMA connectors and a high-frequency signal connector are disposed on the printed circuit board of FIG. 10.

Referring to FIGS. 10 and 11, a cable measuring jig 300 according to an embodiment of the present disclosure may include a substrate 310, a high-frequency signal receiving portion 320, a plurality of high-frequency signal connector mounting portions 330, a plurality of high-frequency signal lines 340, a high-frequency signal receiving connector 350, and a plurality of high-frequency signal connectors 50.

The substrate 310 includes four layers, that is, a surface layer, a first ground layer, a second ground layer, and a bottom layer. In detail, the substrate 310 is formed in a structure in which the bottom layer, a third insulating layer, the second ground layer, a second insulating layer, the first ground layer, a first insulating layer, and the surface layer are laminated in sequence as illustrated in FIG. 7. The first insulating layer, the second insulating layer, and the third insulating layer are manufactured by using FR-4, a type of glass epoxy laminate. The surface layer, the first and second ground layers, and the bottom layer are formed of a metal such as copper having a good electrical conductivity.

The surface layer is formed of a copper foil on a top surface of the substrate 310, in detail, a surface of the first insulating layer. The surface layer may include the high-frequency signal receiving portion 320, the plurality of high-frequency signal connector mounting portions 330, and the plurality of high-frequency signal lines 340. The high-frequency signal receiving portion 320, the plurality of high-frequency signal connector mounting portions 330, and the plurality of high-frequency signal lines 340 of the surface layer may be formed by etching the copper foil provided on the surface of the first insulating layer.

The high-frequency signal receiving portion 320 is provided on the surface of the substrate 310, in detail, on the surface of the first insulating layer, and may be formed so that the high-frequency signal receiving connector 350 to which a connector of a cable for transmitting high-frequency signals, for example, signals of more than 5 GHz can be coupled is disposed in the high-frequency signal receiving portion 320. The high-frequency signal receiving connector 350 is formed to be able to deliver the high-frequency signals, which are transmitted through the cable, without loss. The connector 350 may include a plurality of terminals. The high-frequency signal receiving portion 320 corresponds to the high-frequency signal generation part 120 and 220 of the above-described embodiments.

The plurality of high-frequency signal connector mounting portions 330 are provided on the surface of the substrate 310, in detail, the surface of the first insulating layer, and formed in contact with one side surface 310a of the substrate 310. In the present embodiment, six high-frequency signal connector mounting portions 330 are provided in the substrate 310. A high-frequency signal connector 50 is disposed in each of the six high-frequency signal connector mounting portions 330. Accordingly, each of the high-frequency signal connector mounting portions 330 may be formed in a shape to which a fixing portion 55 of the high-frequency signal connector 50 can be fixed so that the high-frequency signal connector 50 is fixed to each of the high-frequency signal connector mounting portions 330 by soldering.

Each of the plurality of high-frequency signal connector mounting portions 330 may be provided with a plurality of vias 333. The plurality of via 333 are formed to penetrate the first insulating layer, the first ground layer, the second insulating layer, the second ground layer, the third insulating layer, and the bottom layer below the high-frequency signal connector mounting portion 330 in the thickness direction of the substrate 310. The plurality of vias 333 electrically connect the high-frequency signal connector mounting portion 330, the first and second ground layers, and the bottom layer. Solder may be filled inside the plurality of vias 333.

All the six high-frequency signal connector mounting portions 330 are extended to the side surface 310a of the substrate 310. Each of the six high-frequency signal connector mounting portions 330 is formed in the substantially same as the high-frequency signal connector mounting portion 230 as illustrated in FIGS. 6 and 7 as described above. In other words, there is no gap between the side surfaces 310a of the substrate 310 and ends of the six high-frequency signal connector mounting portions 330 so that the side surfaces 310a of the substrate 310 are matched with the ends of the high-frequency signal connector mounting portions 330. At this time, an end of each of the first ground layer, the second ground layer, and the bottom layer provided below the high-frequency signal connector mounting portion 330 is also formed to be matched with the side surface 310a of the substrate 310. Also, some vias 333 formed in parallel to the one side surface 310a of the substrate 310 among the plurality of vias 333 penetrating the substrate 310 are formed such that the cutting surfaces 234 of the some vias 333 are exposed.

Accordingly, when the high-frequency signal connector 50 is disposed in the high-frequency signal connector mounting portion 330, a base 54 of the high-frequency signal connector 50 is directly in contact with the end of the high-frequency signal connector mounting portions 330, the end of the first ground layer, the end of the second ground layer, the end of the bottom layer, and the cutting surfaces of the plurality of vias 333. Also, two upper fixing protrusions 56 and two lower fixing protrusions 57 projecting from the base 54 of the high-frequency signal connector 50 are fixed to the high-frequency signal connector mounting portion 330 and the bottom layer by soldering, respectively. At this time, solder is inserted into the holes of the plurality of cut vias 333 so that the base 54 of the high-frequency signal connector 50 is secured to the side surface 310a of the substrate 310 by soldering. Accordingly, the high-frequency signal connector 50 may be more rigidly fixed to the substrate 310.

The plurality of high-frequency signal lines 340 are formed on the surface of the substrate 310, in detail, the surface of the first insulating layer, and are extended from the high-frequency signal receiving portion 320 near to the plurality of high-frequency signal connector mounting portions 330. An end portion of the high-frequency signal line 340 adjacent to the high-frequency signal connector mounting portion 330 is spaced apart so as not to contact with the high-frequency signal connector mounting portion 330 and the side surface 310a of the substrate 310. A width of the high-frequency signal line 340 may be formed to be the substantially same as a diameter or a width of the signal terminal 58 of the high-frequency signal connector 50. Also, the plurality of high-frequency signal lines 340 are formed to have the same or similar length. Each of the high-frequency signal lines 340 is formed in a straight line so that the deviation in impedance may be minimized. The plurality of high-frequency signal lines 340 are provided to correspond one-to-one to the plurality of pins of the high-frequency signal receiving connector 350 disposed in the high-frequency signal receiving portion 320. In the embodiment of FIGS. 10 and 11, the surface of the substrate 310 is provided with six high-frequency signal lines 340, and the six high-frequency signal lines 340 are formed to have the substantially same width and length.

Also, the ground adjacent to each of the plurality of high-frequency signal lines 340 may generate capacitance component, thereby giving an adverse effect on the impedance of the high-frequency signal lines 340. In order to minimize the adverse effect, the high-frequency signal connector mounting portion 330 corresponding to each of the plurality of high-frequency signal lines 340 may be disposed to be spaced apart a predetermined distance from each of the plurality of high-frequency signal lines 340. At this time, the distance between the high-frequency signal line 340 and the high-frequency signal connector mounting portion 330 may be determined so that the impedance of the high-frequency signal line 340 is about 50Ω.

The substrate 210 may be not provided with vias for connecting the first and second ground layers except for the above-described plurality of vias 333 provided in the high-frequency signal connector mounting portions 330. Accordingly, the impedance of the high-frequency signal line 340 is not affected by the via. If it is needed for at least one via to be formed in the substrate 310, the at least one via may be formed to be spaced away from the high-frequency signal line 340 by a distance in that the at least one via does not affect the impedance of the high-frequency signal line 340.

Each of the six high-frequency signal connector mounting portions 330 is provided with an SMA connector 50 as the high-frequency signal connector.

The SMA connector 50 is disposed in the high-frequency signal connector mounting portion 330 of the substrate 310 so that the connecting portion 51 of a cylindrical shape projects to the outside of the substrate 310. The connecting portion 51 may be coupled to a male SMA connector provided in a cable for connecting other device.

The fixing portion 55 of the SMA connector 50 is formed on the other side surface of the base 54, that is, on the opposite side to the connecting portion 51. The substrate 310 is inserted into between the two upper fixing protrusions 56 and the two lower fixing protrusions 57 of the fixing portion 55. When the side surface 310a of the substrate 310 is inserted into the fixing portion 55 of the SMA connector 50, the two upper fixing protrusions 56 of the fixing portion 55 are positioned on the high-frequency signal mounting portion 330 of the substrate 310, the two lower fixing protrusions 57 are positioned on the bottom layer of the substrate 310, and the signal terminal 58 is positioned on the high-frequency signal line 340. Also, the base 54 of the SMA connector 50 is in contact with the side surface 310a of the substrate 310. Accordingly, when the upper fixing protrusions 56, the lower fixing protrusions 57, and the signal terminal 58 of the SMA connector 50 is secured to the substrate 310 by soldering, the base 54 of the SMA connector 50 is directly in contact with the end of high-frequency signal connector mounting portion 330, the end of the first ground layer, the end of the second ground layer, the end of the bottom layer, and the cutting surfaces of the plurality of vias 333 that are exposed to the side surface 310a of the substrate 310. Since the base 54, the upper fixing protrusions 56, and the lower fixing protrusions 57 of the SMA connector 50 are formed of a material having a good electrical conductivity, the base 54, the upper fixing protrusions 56, and the lower fixing protrusions 57 may function as a ground of the SMA connector 50. Accordingly, when transmitting a high-frequency signal through the high-frequency signal line 340 and the signal terminal 58 of the SMA connector 50, the first ground layer of the substrate 310 and the base 54 of the SMA connector 50 make up a return path of the high-frequency signal.

With the cable measuring jig 300 according to an embodiment of the present disclosure as described above, since the first ground layer forming the return path of the high-frequency signal is directly in contact with the base 54 of the SMA connector 50, the return path is also continuously connected to the SMA connector 50 so that the high-frequency signals can be transmitted effectively.

The inventor performed experiments to check whether the cable measuring jig that is implemented by a printed circuit board having a high-frequency signal connector according to an embodiment of the present disclosure is available to the transmission of high-frequency signals of 5 GHz or more.

First, the impedance of the conventional printed circuit board for signal branches 1 as illustrated in FIG. 1 was measured by a measuring instrument capable of measuring impedance.

Figure 12:
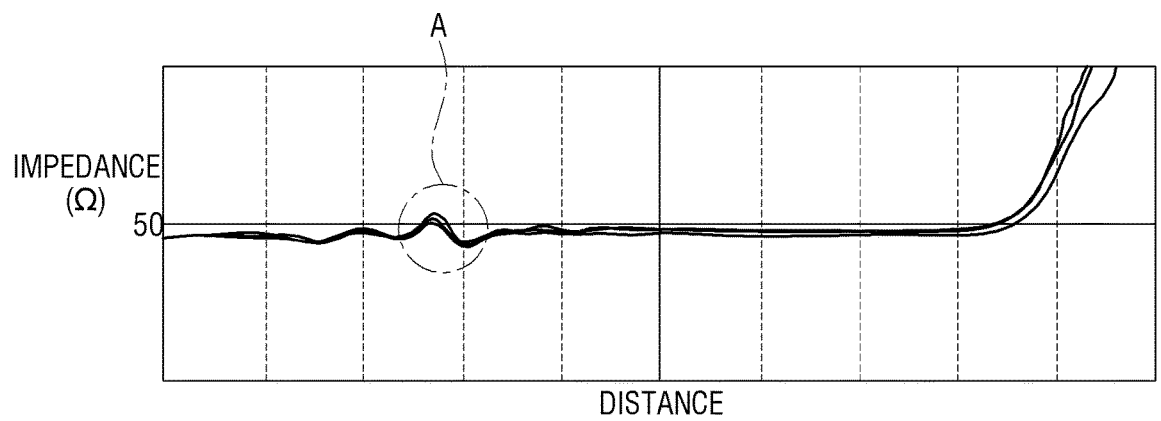
FIG. 12 is a graph illustrating results of measurement of impedance of a conventional printed circuit board for signal branches.

FIG. 12 is a graph illustrating results of measurement of impedance of a conventional printed circuit board for signal branches. For reference, the X-axis of the graph represents a distance of a signal connecting line from the connecting connector to the SMA connector, and the Y-axis represents the impedance.

Referring to FIG. 12, it may be seen that in the conventional printed circuit board for signal branches 1, the impedance of the signal connecting line 7 irregularly changes according to the distance of the signal connecting line 7. In particular, in an A portion of FIG. 12, the deviation of the impedance arises significantly. Accordingly, the conventional printed circuit board for signal branches 1 is not suitable for use in the transmission of high-frequency signals.

Next, the impedance of a cable measuring jig that is implemented by a printed circuit board having a high-frequency signal connector according to an embodiment of the present disclosure as described above was measured by the same measuring instrument.

Figure 13:
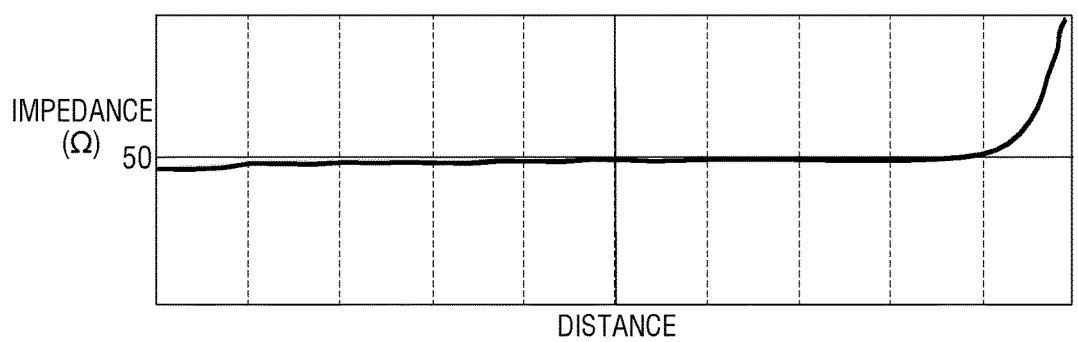
FIG. 13 is a graph illustrating results of measurement of impedance of a cable measuring jig that is implemented by a printed circuit board having a high-frequency signal connector according to an embodiment of the present disclosure.

FIG. 13 is a graph illustrating results of measurement of impedance of a cable measuring jig that is implemented by a printed circuit board having a high-frequency signal connector according to an embodiment of the present disclosure. For reference, the X-axis of the graph represents a distance of a signal connecting line from the high-frequency signal receiving portion to the SMA connector, and the Y-axis represents the impedance.

Referring to FIG. 13, it may be seen that the impedance of the cable measuring jig 300 according to an embodiment of the present disclosure is close to substantially 50Ω, and the impedance is almost not changed depending on the distance. Accordingly, the cable measuring jig 300 that is implemented by a printed circuit board having a high-frequency signal connector according to an embodiment of the present disclosure may be used for transmission of high-frequency signals.

Further, the measurement to compare the insertion-loss of S-parameter for the conventional printed circuit board for signal branches 1 and the cable measuring jig 300 according to an embodiment of the present disclosure having the impedance as described above was performed. The result is illustrated in FIG. 14.

Figure 14:
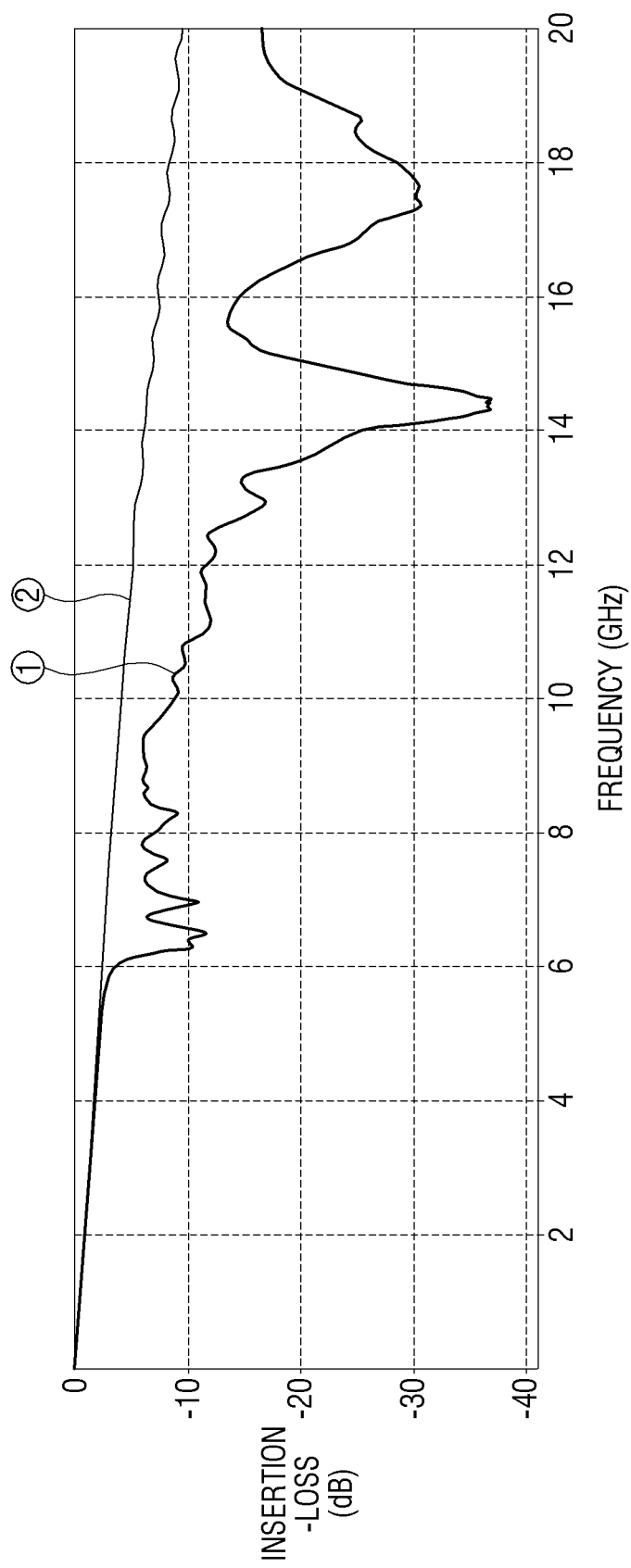
FIG. 14 is a graph illustrating results of measurement of insertion-loss of each of a conventional printed circuit board for signal branches and a cable measuring jig that is implemented by a printed circuit board having a high-frequency signal connector according to an embodiment of the present disclosure.

FIG. 14 is a graph illustrating results of measurement of insertion-loss of each of a conventional printed circuit board for signal branches and a cable measuring jig that is implemented by a printed circuit board having a high-frequency signal connector according to an embodiment of the present disclosure. For reference, the X-axis of the graph represents a frequency GHz of a signal that is applied to the cable measuring jig, and the Y-axis represents the insertion-loss dB.

A curved line ① of FIG. 14 represents the results of the measurement of the insertion-loss of the conventional printed circuit board for signal branches. Referring to FIG. 14, it may be seen from the curved line ① that the insertion-loss increases substantially linearly up to a frequency of about 5 GHz and the insertion-loss irregularly changes in the frequency of more than 5 GHz. Accordingly, the conventional printed circuit board for signal branches may be used to measure the characteristics of the cable for transmitting signals of less than 5 GHz, but it cannot be used to measure the characteristics of a cable for transmitting high-frequency signals of 5 GHz or more.

A curved line ② of FIG. 14 represents the results of the measurement of the insertion-loss of the cable measuring jig that is implemented by a printed circuit board having a high-frequency signal connector according to an embodiment of the present disclosure. Referring to FIG. 14, it may be seen from the curved line ② that the insertion-loss increases substantially linearly up to a high-frequency signal having a frequency of about 20 GHz. Accordingly, the cable measuring jig that is implemented by a printed circuit board having a high-frequency signal connector according to an embodiment of the present disclosure may be used to measure the characteristics of a cable for transmitting high-frequency signals of a range of 5 GHz to 20 GHz.

Hereinafter, a method for testing a high-frequency signal cable using a cable measuring jig that is implemented by a printed circuit board having a high-frequency signal connector according to an embodiment of the present disclosure as illustrated in FIG. 11 will be described with reference to FIGS. 15 and 16.

Figure 15:
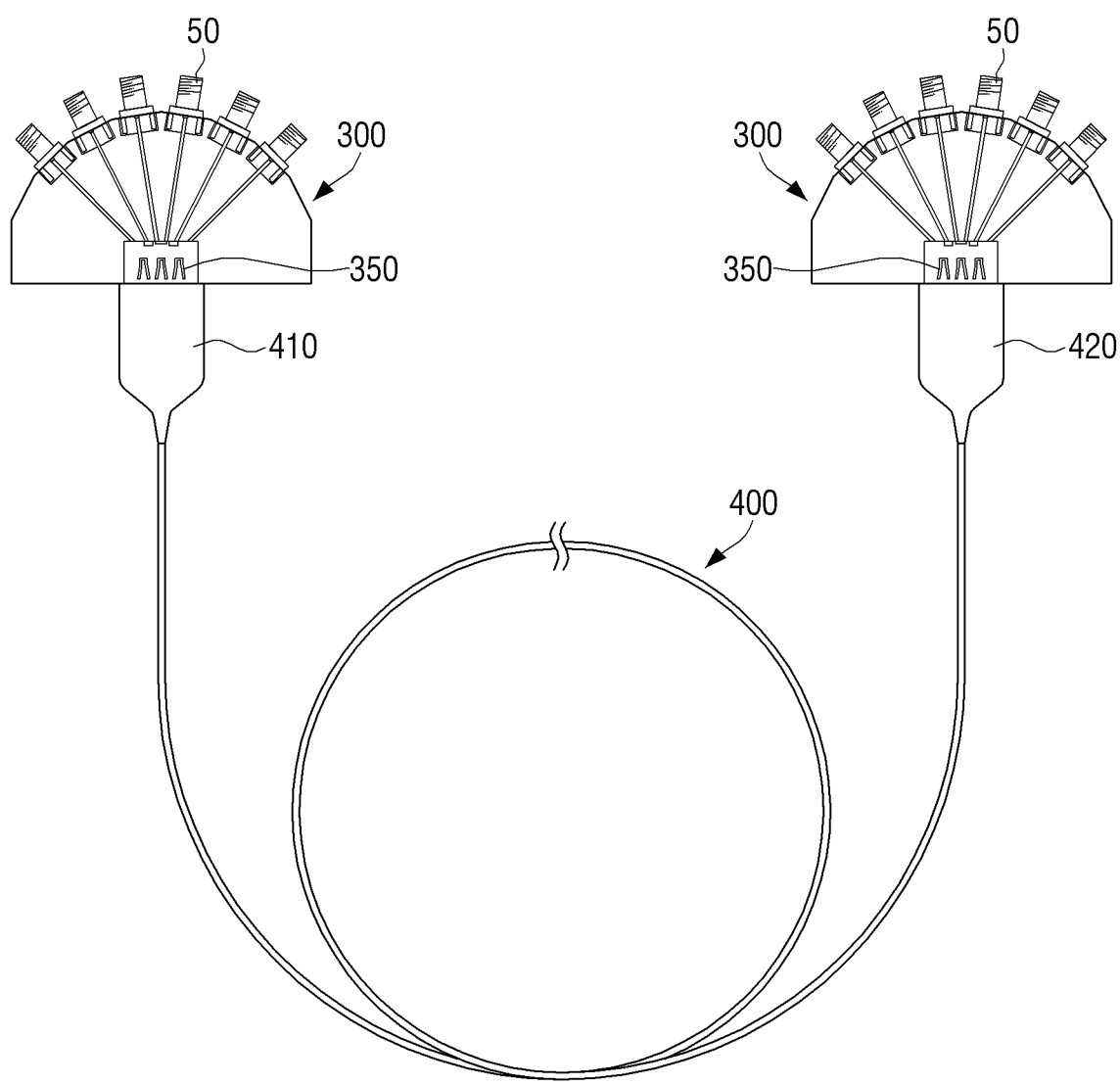
FIG. 15 is a view illustrating a state in which cable measuring jigs that are implemented by a printed circuit board having a high-frequency signal connector according to an embodiment of the present disclosure are disposed in opposite ends of a cable to be inspected.
Figure 16:
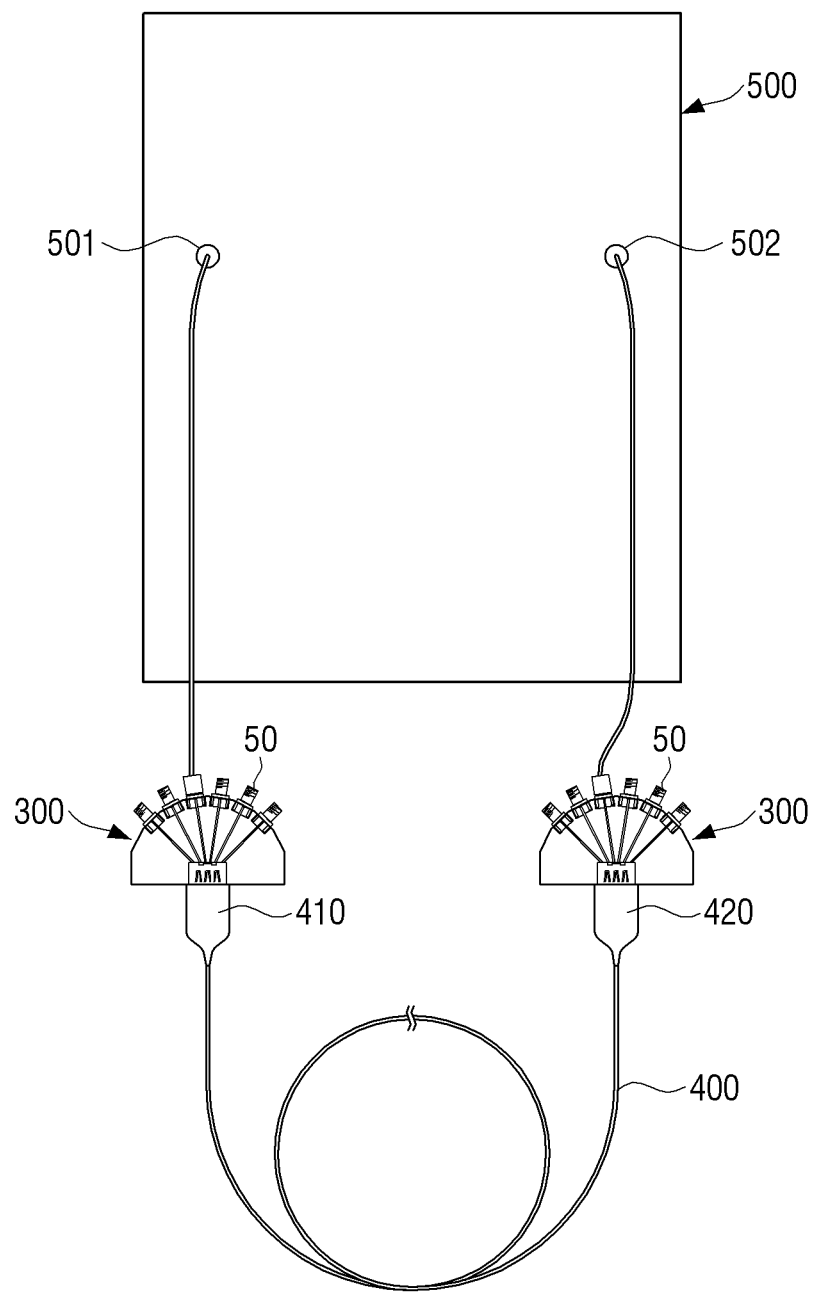
FIG. 16 is a view conceptually illustrating a state in which the characteristics of a cable is tested using a cable measuring jig that is implemented by a printed circuit board having a high-frequency signal connector according to an embodiment of the present disclosure.

FIG. 15 is a view illustrating a state in which cable measuring jigs that are implemented by a printed circuit board having a high-frequency signal connector according to an embodiment of the present disclosure printed circuit boards having a high-frequency signal connector are disposed in opposite ends of a cable to be inspected, and FIG. 16 is a view conceptually illustrating a state in which the characteristics of a cable is tested using the cable measuring jigs that are implemented by a printed circuit board having a high-frequency signal connector according to an embodiment of the present disclosure.

Referring to FIG. 15, opposite ends of a high-frequency signal cable 400 to be measured are provided with the cable measuring jigs 300 according to an embodiment of the present disclosure. In detail, a first connector 410 provided in an end of the high-frequency signal cable 400 is coupled to the connector 350 disposed in the high-frequency signal receiving portion of the first cable measuring jig 300, and a second connector 420 provided in the other end of the high-frequency signal cable 400 is coupled to the connector 350 disposed in the high-frequency signal receiving portion of the second cable measuring jig 300.

Next, one of the six SMA connectors 50 of the first cable measuring jig 300 is coupled to an output terminal 501 of a measuring instrument 500. Also, an input terminal 502 of the measuring instrument 500 is coupled to one of the six SMA connectors 50 of the second cable measuring jig 300. The first cable measuring jig 300 and the second cable measuring jig 300 are connected to the measuring instrument 500 using the SMA connector 50 in the same position. For example, when the third SMA connector 50 of the first cable measuring jig 300 is connected to the output terminal 501 of the measuring instrument 500, the input terminal 502 is connected to the third SMA connector 50 of the second cable measuring jig 300. After that, the measuring instrument 500 transmits a high-frequency signal for measurement through the output terminal 501, and may measure impedance, insertion-loss, etc. by analyzing the high-frequency signal for measurement that enters the input terminal 502 after passing through the first cable measuring jig 300, the high-frequency signal cable 400, and the second cable measuring jig 300.

As described above, the printed circuit board having a high-frequency signal connector according to an embodiment of the present disclosure may be used to transmit high-frequency signals of 5 GHz or more. However, the printed circuit board having a high-frequency signal connector according to an embodiment of the present disclosure may be used to transmit high-frequency signals of 1 GHz or more.

In the above description, the high-frequency signal connector is formed to transmit a single signal. However, the present disclosure as described above may be applied to high-frequency signal connectors that are formed to transmit a plurality of signals.

While the embodiments of the present disclosure have been described, additional variations and modifications of the embodiments may occur to those skilled in the art once they learn of the basic concepts. Therefore, it is intended that the appended claims shall be construed to include both the above embodiments and all such variations and modifications that fall within the spirit and scope of the inventive concepts.

Although a few embodiments have been shown and described, it would be appreciated by those skilled in the art that changes may be made in these embodiments without departing from the principles and spirit thereof, the scope of which is defined in the claims and their equivalents.

What is claimed is:

1. A printed circuit board having a high-frequency signal connector, the board comprising:
    a substrate comprising at least two layers including a surface layer and a first ground layer;
    a high-frequency signal generation part provided in the surface layer of the substrate;
    at least one high-frequency signal connector mounting portion formed in the surface layer of the substrate;
    at least one high-frequency signal line formed in the surface layer of the substrate, the at least one high-frequency signal line extending from the high-frequency signal generation part to the at least one high-frequency signal connector mounting portion; and
    at least one high-frequency signal connector disposed in the at least one high-frequency signal connector mounting portion, the at least one high-frequency signal connector comprising a signal terminal connected to the high-frequency signal line,
    wherein an end of the first ground layer positioned below the at least one high-frequency signal connector mounting portion is exposed to a side surface of the substrate, and
    wherein when the at least one high-frequency signal connector is disposed on the at least one high-frequency signal connector mounting portion, a ground of the at least one high-frequency signal connector is in contact with the end of the first ground layer exposed to the side surface of the substrate.

2. The printed circuit board having a high-frequency signal connector of claim 1, wherein the substrate further comprises:
    a second ground layer disposed below the first ground layer; and
    a connecting portion that connects the first ground layer and the second ground layer, and is exposed to the side surface of the substrate.

3. The printed circuit board having a high-frequency signal connector of claim 2, wherein the connecting portion comprises a plurality of vias that penetrate the high-frequency signal connector mounting portion, the first ground layer, and the second ground layer.

4. The printed circuit board having a high-frequency signal connector of claim 3, wherein the ground of the at least one high-frequency signal connector and the plurality of vias are connected to each other by solder in the plurality of vias.

5. The printed circuit board having a high-frequency signal connector of claim 1, wherein the at least one high-frequency signal line is formed as a straight line.

6. The printed circuit board having a high-frequency signal connector of claim 5, wherein a width of the at least one high-frequency signal line is a same as the width of a signal terminal of the high-frequency signal connector.

7. The printed circuit board having a high-frequency signal connector of claim 5,
    wherein the at least one high-frequency signal connector mounting portion comprises a plurality of high-frequency signal connector mounting portions,
    wherein the at least one high-frequency signal line comprises a plurality of high-frequency signal lines extending from the high-frequency signal generation part to the plurality of high-frequency signal connector mounting portions, and
    wherein the plurality of high-frequency signal lines have an identical length.

8. The printed circuit board having a high-frequency signal connector of claim 1, wherein the high-frequency signal line is spaced apart by a gap from the high-frequency signal connector mounting portion, and the gap between the high-frequency signal line and the high-frequency signal connector mounting portion providing and impedance of the high-frequency signal line of approximately 50Ω.

9. The printed circuit board having a high-frequency signal connector of claim 1, wherein the high-frequency signal connector mounting portion comprises a plurality of vias connecting to the first ground layer.

10. The printed circuit board having a high-frequency signal connector of claim 9, wherein cutting surfaces of some vias that are parallel to the side surface of the substrate among the plurality of vias are formed to be exposed to the side surface of the substrate.

11. The printed circuit board having a high-frequency signal connector of claim 1, wherein when at least one via is provided in the substrate, the at least one via is spaced apart from the high-frequency signal line by a distance where the at least one via does not affect an impedance of the high-frequency signal line.

12. The printed circuit board having a high-frequency signal connector of claim 1, wherein the high-frequency signal generation part is provided with a high-frequency signal receiving connector.

13. A printed circuit board having a high-frequency signal connector, the board comprising:
    a substrate comprising a surface layer, a first ground layer, a second ground layer, and a bottom layer that are laminated in sequence;
    a high-frequency signal receiving portion formed in the surface layer of the substrate;
    a plurality of high-frequency signal connector mounting portions formed in the surface layer of the substrate;
    a plurality of high-frequency signal lines formed in the surface layer of the substrate, the plurality of high-frequency signal lines extend from the high-frequency signal receiving portion to the plurality of high-frequency signal connector mounting portions; and a plurality of high-frequency signal connectors disposed in the plurality of high-frequency signal connector mounting portions, each of the plurality of high-frequency signal connectors comprising a signal terminal connected to each of the plurality of high-frequency signal lines, wherein the substrate comprises a plurality of vias that connect the first ground layer positioned below the plurality of high-frequency signal connector mounting portions and the second ground layer positioned below the first ground layer, wherein an end of the first ground layer, an end of the second ground layer, and cutting surfaces of some of the plurality of vias are exposed to a side surface of the substrate, and wherein when the plurality of high-frequency signal connectors are disposed on the plurality of high-frequency signal connector mounting portions, a ground of each of the plurality of high-frequency signal connectors is in contact with the end of the first ground layer, the end of the second ground layer, and the cutting surfaces of some of the plurality of vias that are exposed to the side surface of the substrate.

14. The printed circuit board having a high-frequency signal connector of claim 13, wherein each of the plurality of high-frequency signal lines is formed as a straight line.

15. The printed circuit board having a high-frequency signal connector of claim 14, wherein a width of each of the plurality of high-frequency signal lines is a same as the width of the signal terminal of the high-frequency signal connector.

16. The printed circuit board having a high-frequency signal connector of claim 14, wherein the plurality of high-frequency signal lines have an identical length.

17. The printed circuit board having a high-frequency signal connector of claim 13, wherein one of the plurality of high-frequency signal lines and one of the plurality of high-frequency signal connector mounting portions corresponding to the one of the plurality of high-frequency signal lines are spaced apart from each other, and a gap between the high-frequency signal line and the high-frequency signal connector mounting portion is determined where impedance of the high-frequency signal line is approximately 50Ω.

18. The printed circuit board having a high-frequency signal connector of claim 13, wherein when at least one via is provided in the substrate, the at least one via is spaced apart from the plurality of high-frequency signal lines by a distance where the at least one via does not affect impedance of each of the plurality of high-frequency signal lines.

19. The printed circuit board having a high-frequency signal connector of claim 13, wherein the high-frequency signal receiving portion is provided with a high-frequency signal receiving connector.

20. The printed circuit board having a high-frequency signal connector of claim 13, wherein the plurality of high-frequency signal connectors comprises a SMA connector.

* * * * *